(12) United States Patent
Lee et al.

(10) Patent No.: US 11,869,775 B2
(45) Date of Patent: Jan. 9, 2024

(54) SEMICONDUCTOR PACKAGES

(71) Applicant: Samsung Electronics Co., Ltd., Suwon-si (KR)

(72) Inventors: Seokhyun Lee, Hwaseong-si (KR); Kyoung Lim Suk, Suwon-si (KR); Ae-Nee Jang, Seoul (KR); Jaegwon Jang, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/169,161

(22) Filed: Feb. 14, 2023

(65) Prior Publication Data
US 2023/0197469 A1  Jun. 22, 2023

Related U.S. Application Data

(63) Continuation of application No. 17/331,751, filed on May 27, 2021, now Pat. No. 11,610,785.

(30) Foreign Application Priority Data

Oct. 27, 2020  (KR) .......................... 10-2020-0140604

(51) Int. Cl.
*H01L 21/56* (2006.01)
*H01L 23/485* (2006.01)
(Continued)

(52) U.S. Cl.
CPC .......... *H01L 21/563* (2013.01); *H01L 23/485* (2013.01); *H01L 23/49816* (2013.01);
(Continued)

(58) Field of Classification Search
CPC ..................................................... H01L 21/563
See application file for complete search history.

(56) References Cited

U.S. PATENT DOCUMENTS 6,177,731 B1  1/2001  Ishida et al.
6,218,302 B1 *  4/2001  Braeckelmann ........ H01L 24/05
                                                                                                     438/653
(Continued)

FOREIGN PATENT DOCUMENTS

JP         3563635 B2    9/2004
KR      100551607 B1    2/2006
(Continued)

*Primary Examiner* — William A Harriston
(74) *Attorney, Agent, or Firm* — Myers Bigel, P.A.

(57) ABSTRACT

Disclosed is a semiconductor package comprising a semiconductor chip, an external connection member on the semiconductor chip, and a dielectric film between the semiconductor chip and the external connection member. The semiconductor chip includes a substrate, a front-end-of-line structure on the substrate, and a back-end-of-line structure on the front-end-of-line structure. The back-end-of-line structure includes metal layers stacked on the front-end-of-line structure, a first dielectric layer on the uppermost metal layer and including a contact hole that vertically overlaps a pad of an uppermost metal layer, a redistribution line on the first dielectric layer and including a contact part in the contact hole and electrically connected to the pad, a pad part, and a line part that electrically connects the contact part to the pad part, and an upper dielectric layer on the redistribution line.

20 Claims, 15 Drawing Sheets

(51) Int. Cl.
   *H01L 23/498*   (2006.01)
   *H01L 21/60*    (2006.01)
   *H01L 23/00*    (2006.01)

(52) U.S. Cl.
   CPC .............. *H01L 24/05* (2013.01); *H01L 24/13* (2013.01); *H01L 24/73* (2013.01); *H01L 21/60* (2021.08); *H01L 2224/023* (2013.01); *H01L 2224/0508* (2013.01); *H01L 2224/05022* (2013.01); *H01L 2224/05548* (2013.01); *H01L 2224/13024* (2013.01); *H01L 2224/73204* (2013.01); *H01L 2924/15311* (2013.01)

(56) References Cited

U.S. PATENT DOCUMENTS

| | | | |
|---|---|---|---|
| 6,277,669 B1 | 8/2001 | Kung et al. | |
| 8,035,226 B1 | 10/2011 | Wilcoxen et al. | |
| 8,304,867 B2 * | 11/2012 | McCarthy | H01L 24/06 257/669 |
| 8,372,689 B2 | 2/2013 | Lee et al. | |
| 8,436,255 B2 | 5/2013 | Goh | |
| 8,957,694 B2 | 2/2015 | Hu et al. | |
| 9,136,235 B2 * | 9/2015 | Tu | H01L 23/3171 |
| 9,485,868 B2 | 11/2016 | Tao | |
| 10,629,555 B2 * | 4/2020 | Chen | H01L 24/09 |
| 10,818,627 B2 * | 10/2020 | Liu | H01L 24/14 |
| 2004/0094841 A1 | 5/2004 | Matsuzaki et al. | |
| 2006/0214293 A1 * | 9/2006 | Park | H01L 23/3114 257/737 |
| 2006/0226542 A1 * | 10/2006 | Chien | H01L 24/02 257/737 |
| 2007/0172690 A1 | 7/2007 | Kim et al. | |
| 2007/0176175 A1 | 8/2007 | Shioga et al. | |
| 2007/0205520 A1 * | 9/2007 | Chou | H01L 24/12 257/E23.129 |
| 2008/0224326 A1 * | 9/2008 | Kuo | H01L 24/13 257/E23.141 |
| 2009/0278263 A1 * | 11/2009 | McCarthy | H01L 23/525 257/E23.141 |
| 2009/0283877 A1 * | 11/2009 | Tsai | H01L 24/11 257/659 |
| 2010/0102444 A1 | 4/2010 | Khor et al. | |
| 2012/0006592 A1 | 1/2012 | Ouchi et al. | |
| 2012/0061823 A1 | 3/2012 | Wu et al. | |
| 2015/0364430 A1 | 12/2015 | Lin | |
| 2016/0043047 A1 | 2/2016 | Shim et al. | |
| 2016/0315060 A1 | 10/2016 | Umemoto et al. | |
| 2016/0351516 A1 | 12/2016 | Karlovsky et al. | |
| 2017/0062321 A1 | 3/2017 | Choi et al. | |
| 2017/0110401 A1 | 4/2017 | Lii et al. | |
| 2017/0179062 A1 | 6/2017 | Jang et al. | |
| 2017/0352631 A1 | 12/2017 | Chuang | |
| 2019/0027453 A1 | 1/2019 | Kim et al. | |
| 2020/0105682 A1 | 4/2020 | Liu et al. | |
| 2020/0248329 A1 | 8/2020 | Dadvand | |

FOREIGN PATENT DOCUMENTS

| | | |
|---|---|---|
| KR | 101752376 B1 | 6/2017 |
| KR | 20200042658 A | 4/2020 |

\* cited by examiner

SEMICONDUCTOR PACKAGES

CROSS-REFERENCE TO RELATED APPLICATION

This U.S. non-provisional application is a continuation of and claims priority to U.S. patent application Ser. No. 17/331,751, filed May 27, 2021, which claims priority under 35 U.S.C § 119 to Korean Patent Application No. 10-2020-0140604 filed on Oct. 27, 2020, the disclosures of which are hereby incorporated by reference in their entirety.

BACKGROUND

The present inventive concepts relate to semiconductor packages. In the semiconductor industry, high capacity, thinness, and small size of semiconductor devices and electronic products using the same have been demanded and thus various package techniques have been suggested. A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the PCB. With the development of the electronics industry, demand has increased for electronic products having high performance, high speed, and compact size.

SUMMARY

Some example embodiments of the present inventive concepts provide a semiconductor package with enhanced electrical properties and increased reliability and a method of fabricating the same.

According to some example embodiments of the present inventive concepts, a semiconductor package may comprise: a semiconductor chip; an external connection member on the semiconductor chip; and a dielectric film between the semiconductor chip and the external connection member. The semiconductor chip may include: a substrate; a front-end-of-line structure on the substrate; and a back-end-of-line structure on the front-end-of-line structure. The back-end-of-line structure may include: a plurality of metal layers stacked on the front-end-of-line structure, an uppermost one of the metal layers including a pad therein; a first dielectric layer on the uppermost metal layer, the first dielectric layer including a contact hole that vertically overlaps the pad; a redistribution line on the first dielectric layer, the redistribution line including a contact part in the contact hole and electrically connected to the pad, a pad part, and a line part that electrically connects the contact part to the pad part; and an upper dielectric layer on the redistribution line. The upper dielectric layer may have: a first opening that vertically overlaps the contact part; and a second opening that vertically overlaps the pad part. The external connection member may include an under-bump pattern electrically connected through the second opening to the pad part. The contact part may include a dent in an upper portion of the contact part. The first opening may expose the dent. The dielectric film may include a first recess in a top surface of the dielectric film. The first recess may vertically overlap the dent.

According to some example embodiments of the present inventive concepts, a semiconductor package may comprise; a semiconductor chip; and an external connection member on the semiconductor chip. The semiconductor chip may include: a substrate; a front-end-of-line structure on the substrate; and a back-end-of-line structure on the front-end-of-line structure. The back-end-of-line structure may include: a plurality of metal layers stacked on the front-end-of-line structure, an uppermost one of the metal layers including a pad therein; a first dielectric layer on the uppermost metal layer; a redistribution line on the first dielectric layer and electrically connected to the pad; and an upper dielectric layer on the redistribution line. The external connection member may include an under-bump pattern electrically connected to the redistribution line through an opening of the upper dielectric layer. The redistribution line may include a first recess in an upper portion of the redistribution line. A lower portion of the under-bump pattern may be in the first recess.

According to some example embodiments of the present inventive concepts, a semiconductor package may comprise a wafer level package that includes a semiconductor chip and an external connection member on the semiconductor chip. The semiconductor chip may include: a substrate; a front-end-of-line structure on the substrate; and a back-end-of-line structure on the front-end-of-line structure. The back-end-of-line structure may include: a plurality of metal layers stacked on the front-end-of-line structure, an uppermost one of the metal layers including a pad therein; a first dielectric layer on the uppermost metal layer; a redistribution line on the first dielectric layer and electrically connected to the pad; and an upper dielectric layer on the redistribution line. The external connection member may include an under-bump pattern electrically connected to the redistribution line through an opening of the upper dielectric layer. The first dielectric layer may include a first region and a second region beside the first region. The first region may vertically overlap the redistribution line. The redistribution line may include a first sidewall at an end of the redistribution line. The second region may include a first recess in an upper portion of the second region. An inner wall of the first recess may include a second sidewall connected to the first sidewall. A slope of the first sidewall may be different from a slope of the second sidewall.

DETAILED DESCRIPTION

Figure 1:
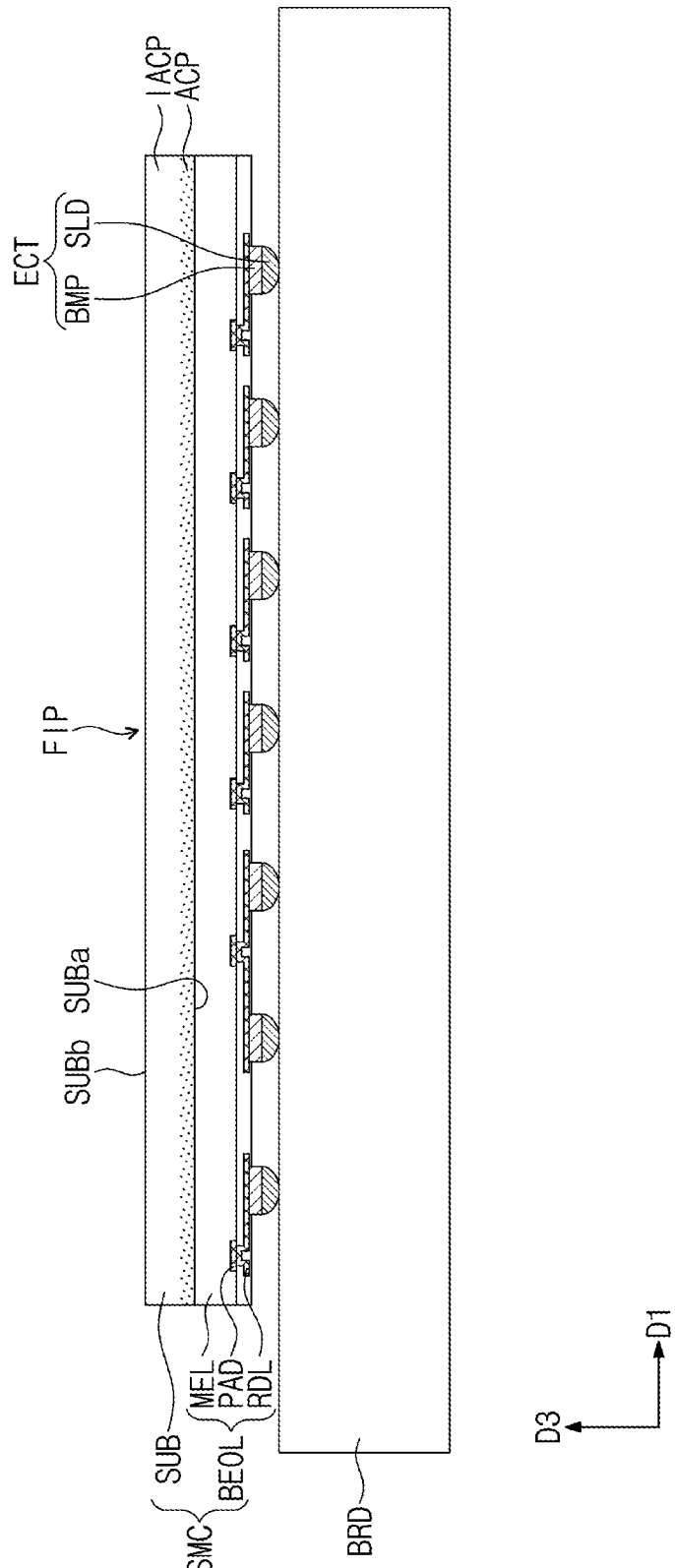
FIG. 1 illustrates a cross-sectional view showing a wafer level package according to some example embodiments of the present inventive concepts.
Figure 2:
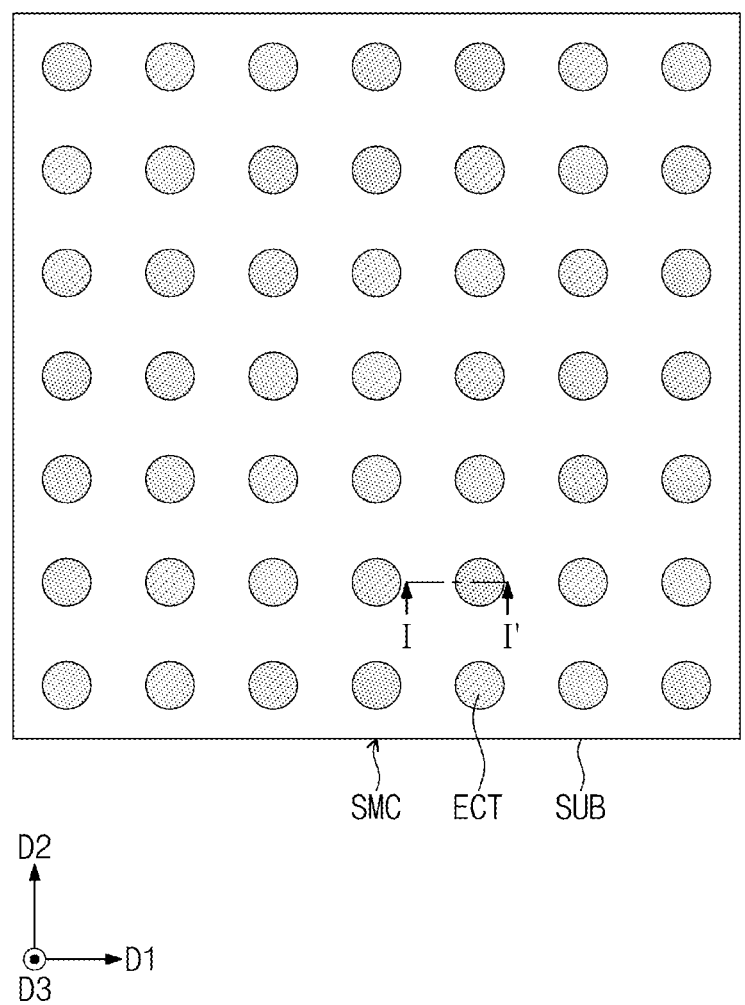
FIG. 2 illustrates a plan view showing a bottom surface of the semiconductor package depicted in FIG. 1.
Figure 3:
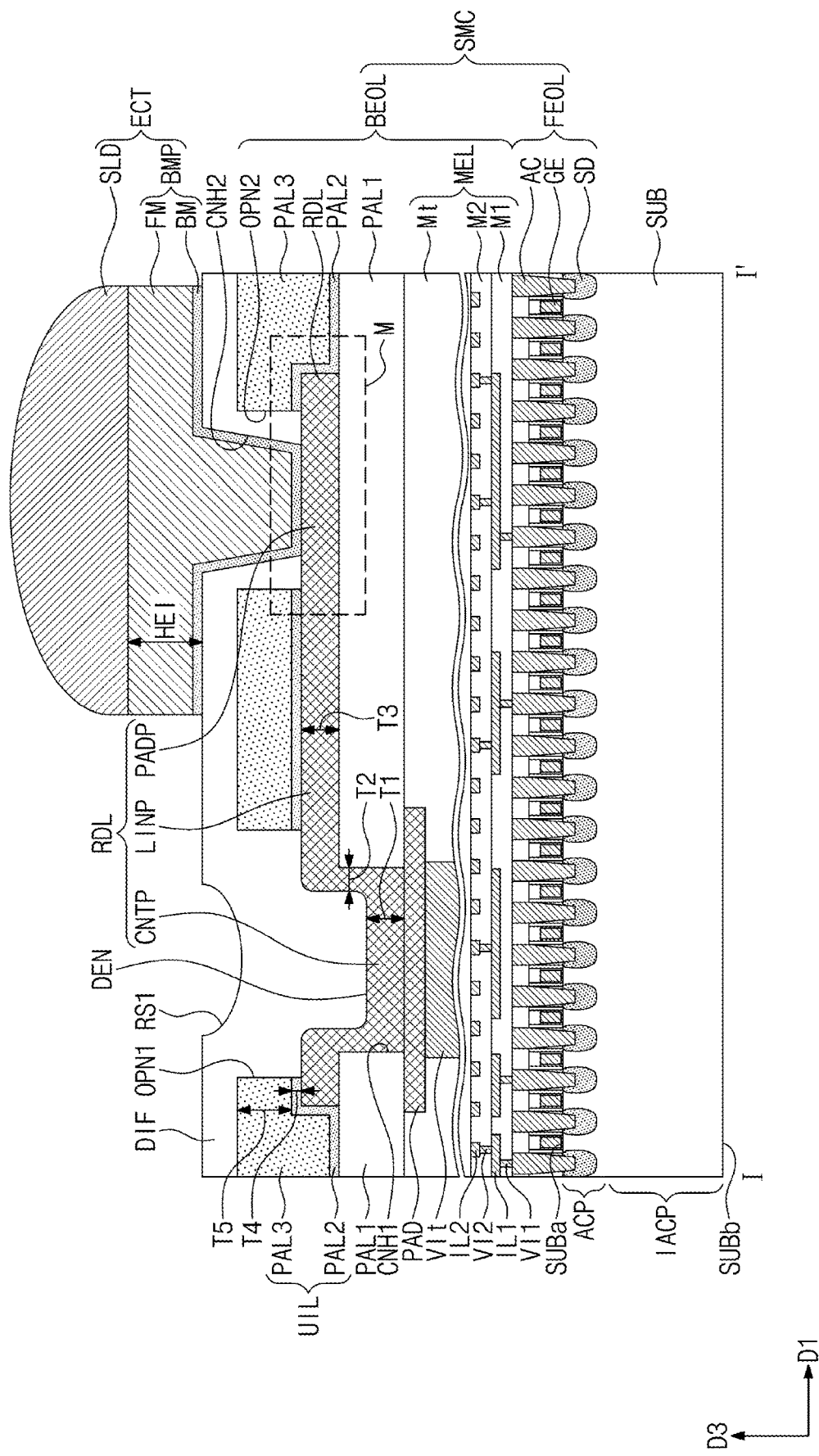
FIG. 3 illustrates a cross-sectional view taken along line I-I' of FIG. 2.
Figure 4:
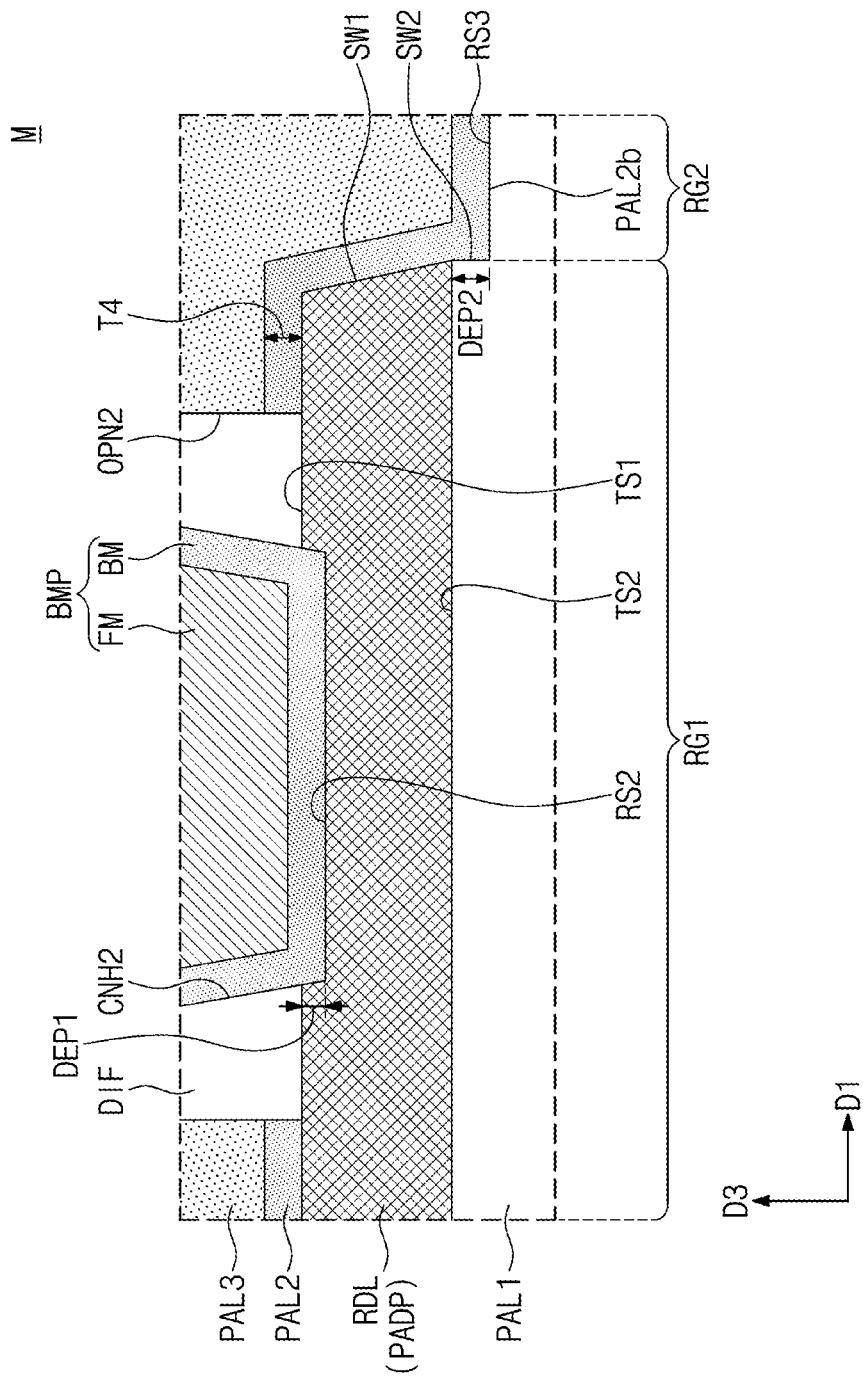
FIG. 4 illustrates an enlarged cross-sectional view showing section M of FIG. 3.

FIG. 1 illustrates a cross-sectional view showing a wafer level package according to some example embodiments of the present inventive concepts. FIG. 2 illustrates a plan view showing a bottom surface of the semiconductor package depicted in FIG. 1. FIG. 3 illustrates a cross-sectional view taken along line I-I' of FIG. 2. FIG. 4 illustrates an enlarged cross-sectional view showing section M of FIG. 3.

Referring to FIG. 1, a board BRD may be provided thereon with a wafer level package FIP according to some example embodiments of the present inventive concepts. The wafer level package FIP may be flip-chip mounted on the board BRD. For example, the wafer level package FIP may be mounted on the board BRD such that the wafer level package FIP may expose its top surface, or a second surface SUBb of a substrate SUB which will be discussed below.

The wafer level package FIP may include a semiconductor chip SMC and external connection members ECT on the semiconductor chip SMC. For example, the semiconductor chip SMC may include a substrate SUB and a back-end-of-line structure BEOL on the substrate SUB. The substrate SUB may have a first surface SUBa and a second surface SUBb opposite to the first surface SUBa. The substrate SUB may include an active section ACP adjacent to the first surface SUBa and an inactive section IACP adjacent to the second surface SUBb. As discussed below, the active section ACP may include a plurality of transistors that constitute an integrated circuit. The semiconductor chip SMC according to some example embodiments of the present inventive concepts may be either a memory chip, such as a dynamic random access memory (DRAM) chip or a VNAND (vertical NAND Flash memory) chip, or a logic chip, such as a system-on-chip (SOC).

The back-end-of-line structure BEOL may include a metal layer MEL on the first surface SUBa of the substrate SUB, redistribution lines RDL on the metal layer MEL, and pads PAD between the metal layer MEL and the redistribution lines RDL. The metal layer MEL may be connected to the active section ACP. As discussed below, the metal layer MEL may include a plurality of stacked metal layers.

The external connection members ECT may be provided on corresponding redistribution lines RDL. The external connection member ECT may include an under-bump pattern BMP electrically connected to the redistribution line RDL and a solder pattern SLD on the under-bump pattern BMP. The wafer level package FIP may be connected through the external connection members ECT to the board BRD. Although not shown, an under-fill layer may fill a gap between the wafer level package FIP and the board BRD.

The wafer level package FIP according to some example embodiments may include the semiconductor chip SMC, the redistribution lines RDL, and the external connection members ECT. The redistribution lines RDL and the external connection members ECT may be restrictively disposed on an area that vertically overlaps the semiconductor chip SMC. Neither the redistribution lines RDL nor the external connection members ECT may externally expand over an area that vertically overlaps the substrate SUB. For example, the wafer level package FIP according to some example embodiments may be a fan-in wafer level package.

Referring to FIGS. 2 and 3, the active section ACP may be adjacent to the first surface SUBa of the substrate SUB, and the inactive section IACP may be adjacent to the second surface SUBb of the substrate SUB. Referring back to FIG. 1, as the wafer level package FIP is flip-chip mounted on the board BRD, the second surface SUBb of the substrate SUB may become the exposed top surface of the wafer level package FIP.

A front-end-of-line structure FEOL may be provided on the active section ACP of the substrate SUB. For example, a plurality of source/drain patterns SD may be provided in the active section ACP of the substrate SUB. A plurality of gate electrodes GE may be provided on the active section ACP. For example, the plurality of gate electrodes GE may be provided on the first surface SUBa of the substrate SUB. Each of the gate electrodes GE may be interposed between a pair of neighboring source/drain patterns SD. A plurality of transistors may be constituted by the gate electrodes GE and the active section ACP that includes the source/drain patterns SD.

A plurality of active contacts AC may be provided to have connection with corresponding source/drain patterns SD. Although not shown, a plurality of gate contacts may further be provided to have connection with corresponding gate electrodes GE.

The contacts and the transistors on the active section ACP may be formed through a front-end-of-line process in fabrication of the semiconductor chip SMC. For example, the transistors and the contacts may constitute the front-end-of-line structure FEOL of the semiconductor chip SMC.

The back-end-of-line structure BEOL may be provided on the front-end-of-line structure FEOL. The back-end-of-line structure BEOL may include a metal layer MEL on the front-end-of-line structure FEOL, and also include a first dielectric layer PAL1, a redistribution line RDL, a second dielectric layer PAL2, and a third dielectric layer PAL3 that are provided on the metal layer MEL For example, the metal layer MEL may include a plurality of metal layers M1, M2, . . . , and Mt that are sequentially stacked. For example, a first metal layer M1 or a lowermost metal layer in the metal layer MEL may include first wiring lines IL1 and first vias VI1 below the first wiring lines IL1. The first wiring lines IL1 may be connected through the first vias VI1 to the active contacts AC of the front-end-of-line structure FEOL. The second metal layer M2 on the first metal layer M1 may include second wiring lines IL2 and second vias VI2 below the second wiring lines IL2. The second wiring lines IL2 may be connected through the second vias VI2 to the first wiring lines IL1.

The metal layer Mt or an uppermost metal layer in the metal layer MEL may include at least one pad PAD and an uppermost via VIt below the pad PAD. A plurality of metal layers may be interposed between the second metal layer M2 and the uppermost metal layer Mt, and no limitation is imposed on the number of the metal layers.

The wiring lines in the metal layer MEL, the vias, and the pad PAD may each include at least one metal selected from aluminum, copper, tungsten, molybdenum, and cobalt. For example, the first and second wiring lines IL1 and IL2 may include copper, and the pad PAD may include aluminum.

The metal layer MEL may be provided thereon with the first dielectric layer PAL1 that covers the pad PAD. The first dielectric layer PAL1 may include a first contact hole CNH1 that vertically overlaps (e.g., exposes) at least a portion of a top surface of the pad PAD. The first dielectric layer PAL1 may include a silicon nitride layer, a silicon oxide layer, or a silicon oxynitride layer.

In some example embodiments of the present inventive concepts, the first dielectric layer PAL1 may include a plurality of stacked dielectric layers. At least one of the stacked dielectric layers may include a silicon nitride layer, and another of the stacked dielectric layers may include a silicon oxide layer.

At least one redistribution line RDL may be disposed on the first dielectric layer PAL1. The redistribution line RDL may include a contact part CNTP that fills at least a portion of the first contact hole CNH1, a pad part PADP electrically connected to the under-bump pattern BMP, and a line part LINP that extends from the contact part CNTP toward the pad part PADP.

The redistribution line RDL may be electrically connected through the contact part CNTP to the pad PAD. The contact part CNTP on the pad PAD may have a first thickness T1 in a direction (e.g., a third direction D3) perpendicular to the first surface SUBa of the substrate SUB. The contact part CNTP on an inner wall of the first contact hole CNH1 may have a second thickness T2 in a direction (e.g., a first direction D1) parallel to the first surface SUBa of the substrate SUB. The first thickness T1 may be greater than the second thickness T2. For example, the first thickness T1 may range from about 1 micrometers (μm) to about 8 μm.

The contact part CNTP may fill the first contact hole CNH1 and have a dent DEN on an upper portion thereof. For example, the dent DEN may have a bottom surface lower than a top surface of the first dielectric layer PAL1.

The first dielectric layer PAL1 may be provided on its top surface with the line part LINP shaped like a line that extends in a direction (e.g., the first direction D1) parallel to the first surface SUBa of the substrate SUB. The line part LINP may have a third thickness T3 in the third direction D3. The third thickness T3 may be substantially the same as the first thickness T1.

The formation of the redistribution line RDL may include depositing a metal layer and then using a hardmask to pattern the metal layer. The redistribution line RDL may include metal capable of undergoing deposition and etching processes. For example, the redistribution line RDL may include aluminum (Al).

The redistribution line RDL may be provided thereon with the second dielectric layer PAL2 that directly covers a surface of the redistribution line RDL. The first dielectric layer PAL1 may be covered with the second dielectric layer PAL2 disposed on a portion of its top surface on which the redistribution line RDL is not disposed. The third dielectric layer PAL3 may be provided on the second dielectric layer PAL2.

The second and third dielectric layers PAL2 and PAL3 may constitute an upper dielectric layer UIL. The upper dielectric layer UIL may include a first opening OPN1 that vertically overlaps (e.g., exposes) the contact part CNTP of the redistribution line RDL and a second opening OPN2 that vertically overlaps (e.g., exposes) the pad part PADP of the redistribution line RDL.

The second dielectric layer PAL2 may have a fourth thickness T4. The third dielectric layer PAL3 may have a fifth thickness T5. The fifth thickness T5 may be greater than the fourth thickness T4. For example, the fourth thickness T4 may range from about 0.1 μm to about 3 μm, and the fifth thickness T5 may range from about 0.3 μm to about 6 μm.

The second dielectric layer PAL2 may include an inorganic dielectric layer, such as a silicon nitride layer, a silicon oxide layer, or a silicon oxynitride layer. The third dielectric layer PAL3 may include an organic polymer layer. For example, the organic polymer layer may include polyimide, fluorocarbon, resin, or synthetic rubber.

The metal layer MEL, the first, second, and third dielectric layers PAL1, PAL2, and PAL3, and the redistribution line RDL included in the back-end-of-line structure BEOL discussed above may be formed through a back-end-of-line process in fabrication of the semiconductor chip SMC.

A dielectric film DIF may be provided on the back-end-of-line structure BEOL. The dielectric film DIF may fill the first and second openings OPN1 and OPN2 of the upper dielectric layer UIL. The dielectric film DIF may include a first recess RS1 on a top surface thereof. The first recess RS1 may vertically overlap the dent DEN of the contact part CNTP included in the redistribution line RDL. The dielectric film DIF may include an organic polymer layer.

The dielectric film DIF may include a second contact hole CNH2 that vertically overlaps (e.g., exposes) at least a portion of a top surface of the pad part PADP included in the redistribution line RDL. The second contact hole CNH2 may be formed in the dielectric film DIF that fills the second opening OPN2. The second contact hole CNH2 may have a diameter less than that of the second opening OPN2.

The dielectric film DIF may be provided thereon with the external connection member ECT connected to the redistribution line RDL. For example, the under-bump pattern BMP of the external connection member ECT may be provided on the dielectric film DIF and may fill the second contact hole CNH2. For example, the under-bump pattern BMP may be electrically connected through the second contact hole CNH2 to the pad part PADP of the redistribution line RDL. The dielectric film DIF may separate the under-bump pattern BMP in the second contact hole CNH2 from the upper dielectric layer UIL.

The under-bump pattern BMP may include a seed pattern BM and a conductive pattern FM on the seed pattern BM. The seed pattern BM may cover a bottom surface of the conductive pattern FM. The seed pattern BM may be interposed between the dielectric film DIF and the conductive pattern FM. For example, the seed pattern BM may include a conductive material, such as copper, titanium, or an alloy thereof. The seed pattern BM may serve as a barrier layer and may prevent/impede diffusion of metal contained in the conductive pattern FM. The conductive pattern FM may include copper.

The under-bump pattern BMP may have a first height HE1 on the top surface of the dielectric film DIF. The first height HE1 may be a distance between the top surface of the dielectric film DIF and a top surface of the under-bump pattern BMP. The first height HE1 may range from about 1 μm to about 50 μm. In more detail, the first height HE1 may range from about 5 μm to about 50 μm.

The solder pattern SLD of the external connection member ECT may be disposed on the under-bump pattern BMP. The under-bump pattern BMP may serve as a pad for the solder pattern SLD. The formation of the solder pattern SLD may include performing a solder-ball attachment process on the under-bump pattern BMP.

The external connection member ECT and the dielectric film DIF on the back-end-of-line structure BEOL may be formed in a package process, or a Post-FAB process. According to some example embodiments of the present inventive concepts, the redistribution line RDL may be formed not through a Post-FAB process, but through an In-FAB process (e.g., a back-end-of-line process for a semiconductor chip). In this case, because the redistribution line RDL is formed by using a fabrication process for a semiconductor chip, there may be an advantage that the redistribution line RDL is formed in an In-FAB process without requiring additional equipment investment.

The wafer level package FIP according to some example embodiments of the present inventive concepts may be configured such that the first height HE1 of the under-bump pattern BMP is relatively high, or equal to or greater than about 20 μm. As such, when the wafer level package FIP is flip-chip mounted on the board BRD as illustrated in FIG. 1, it may be possible to increase bump-level reliability.

Referring to FIG. 4, the pad part PADP of the redistribution line RDL may include a second recess RS2 in an upper portion thereof. The second recess RS2 may be defined by (e.g., may be a lower part of) the second contact hole CNH2. The second recess RS2 may have a first depth DEP1. For example, the first depth DEP1 may indicate a vertical distance between a top surface TS1 of the pad part PADP covered with the dielectric film DIF and a bottom surface of the second recess RS2. A lower portion of the under-bump pattern BMP may be in (e.g., may fill) the second recess RS2. For example, the seed pattern BM of the under-bump pattern BMP may have a thickness greater than the first depth DEP1 of the second recess RS2.

The under-bump pattern BMP may have a lower sidewall in contact with a sidewall of the second recess RS2. In this case, the second recess RS2 may increase a contact area between the under-bump pattern BMP and the pad part PADP. In conclusion, the under-bump pattern BMP and the pad part PADP may have therebetween a low resistance to increase electrical properties.

The first dielectric layer PAL1 may include a third recess RS3 at its upper portion that does not overlap the redistribution line RDL. The third recess RS3 may be an area that does not vertically overlap the redistribution line RDL. The third recess RS3 may be an area spaced apart from the redistribution line RDL.

The first dielectric layer PAL1 may include a first region RG1 and a second region RG2 that is beside (i.e., horizontally adjacent) the first region RG1. The first region RG1 may be an area that vertically overlaps the redistribution line RDL. The second region RG2 may be an area where the third recess RS3 is formed. The first region RG1 may have a top surface TS2 higher than that of the second region RG2.

The third recess RS3 may have a second depth DEP2. For example, the second depth DEP2 may indicate a vertical distance between the top surface TS2 on the first region RG1 of the first dielectric layer PAL1 and a bottom surface of the third recess RS3. For example, the second depth DEP2 may be greater than the first depth DEP1.

The redistribution line RDL may have a first sidewall SW1 at an end thereof. The third recess RS3 may have an inner wall that includes a second sidewall SW2. The first sidewall SW1 may be connected to the second sidewall SW2. The first and second sidewalls SW1 and SW2 may have respective slopes different from each other. For example, the second sidewall SW2 may be steeper than the first sidewall SW1.

The second dielectric layer PAL2 may extend from the top surface TS1 of the redistribution line RDL toward the bottom surface of the third recess RS3, while covering the first and second sidewalls SW1 and SW2. The second dielectric layer PAL2 in the third recess RS3 may have a bottom surface PAL2$b$ lower than the top surface TS2 on the first region RG1 of the first dielectric layer PAL1. The bottom surface PAL2$b$ of the second dielectric layer PAL2 may be lower than a bottom surface of the redistribution line RDL. The fourth thickness T4 of the second dielectric layer PAL2 may be substantially the same as or less than the second depth DEP2.

FIGS. 5 to 9 illustrate cross-sectional views taken along line I-I' of FIG. 2, showing a method of fabricating a wafer level package according to some example embodiments of the present inventive concepts.

Figure 5:
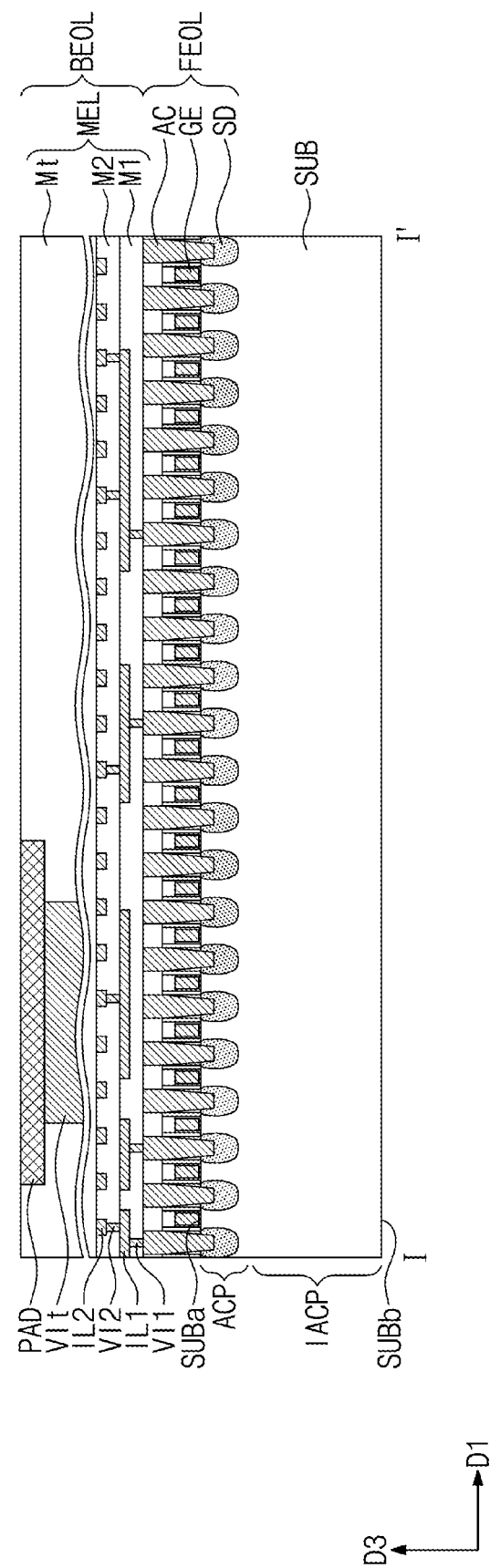
FIGS. 5 to 9 illustrate cross-sectional views taken along line I-I' of FIG. 2, showing a method of fabricating a wafer level package according to some example embodiments of the present inventive concepts.

Referring to FIG. 5, a front-end-of-line process for a semiconductor chip may be employed to form a front-end-of-line structure FEOL on a first surface SUBa of a substrate SUB. For example, a plurality of source/drain patterns SD may be formed in an upper portion of an active section ACP of the substrate SUB. A plurality of gate electrodes GE may be formed on the active section ACP. A plurality of active contacts AC may be formed to have connection with corresponding source/drain patterns SD.

A back-end-of-line process for a semiconductor chip may be performed to form a metal layer MEL on the front-end-of-line structure FEOL. For example, the formation of the metal layer MEL may include sequentially forming a plurality of metal layers M1, M2, ..., and Mt. An uppermost metal layer Mt in the metal layer MEL may include at least one pad PAD.

Figure 6:
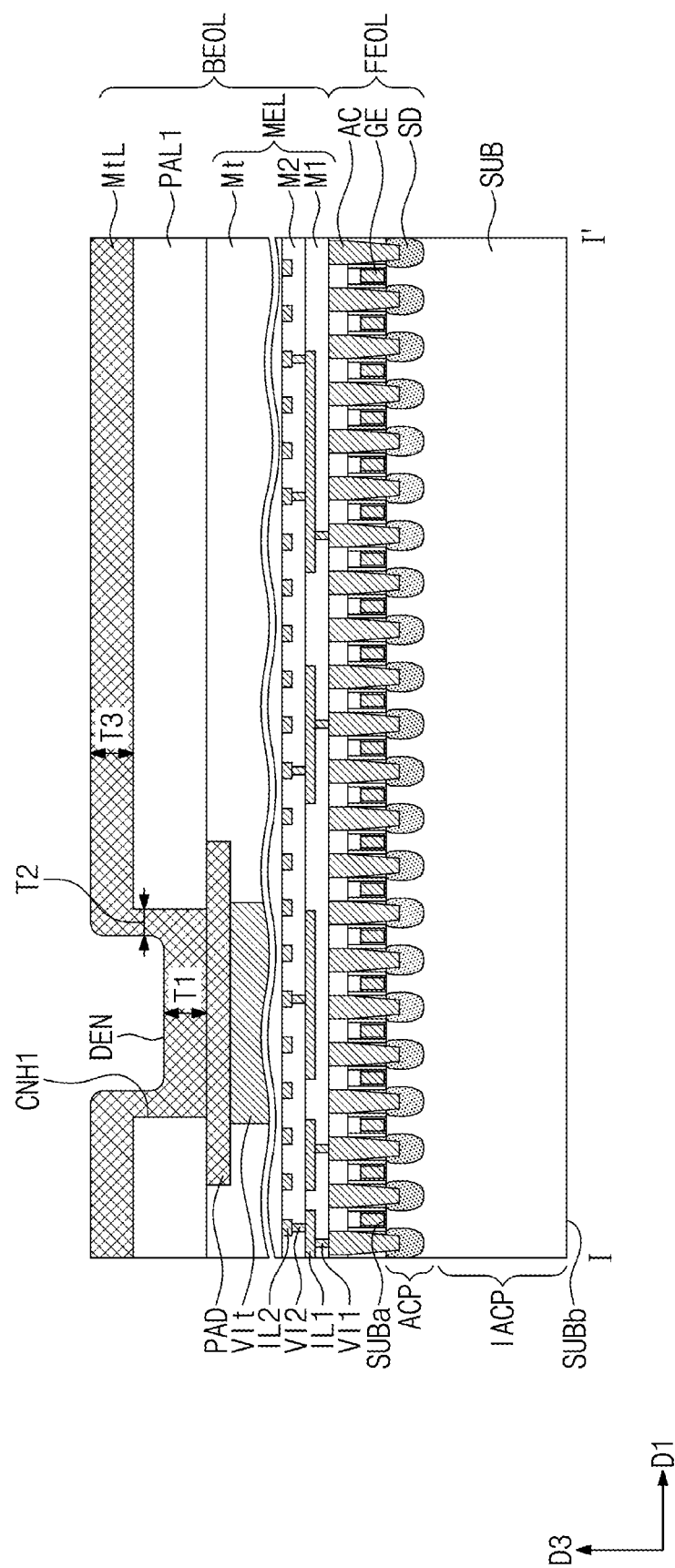

Referring to FIG. 6, the back-end-of-line process for a semiconductor chip may form a first dielectric layer PAL1 and a conductive layer MtL on the metal layer MEL. For example, a deposition process may be employed to form the first dielectric layer PAL1 on the uppermost metal layer Mt. The first dielectric layer PAL1 may be patterned to form a first contact hole CNH1 that vertically overlaps (e.g., exposes) the pad PAD.

A deposition process may be employed to form the conductive layer MtL on the first dielectric layer PAL1. The conductive layer MtL may be formed by using physical vapor deposition (PVD), such as sputtering. The conductive layer MtL may also be formed in the first contact hole CNH1 and may thus be connected to the pad PAD. The conductive layer MtL may be formed of metal capable of being deposited.

A first portion of the conductive layer MtL on the pad PAD may have a first thickness T1 in a third direction D3. A second portion of the conductive layer MtL on an inner wall of the first contact hole CNH1 may have a second thickness T2 in a first direction D1. A third portion of the conductive layer MtL may have a third thickness T3 on a top surface of the first dielectric layer PAL1. Because the conductive layer MtL is formed by physical vapor deposition (PVD) whose step coverage is poor, the second thickness T2 may be less than the first thickness T1 and the third thickness T3. The first thickness T1 and the third thickness T3 may be substantially the same as each other.

Figure 7:
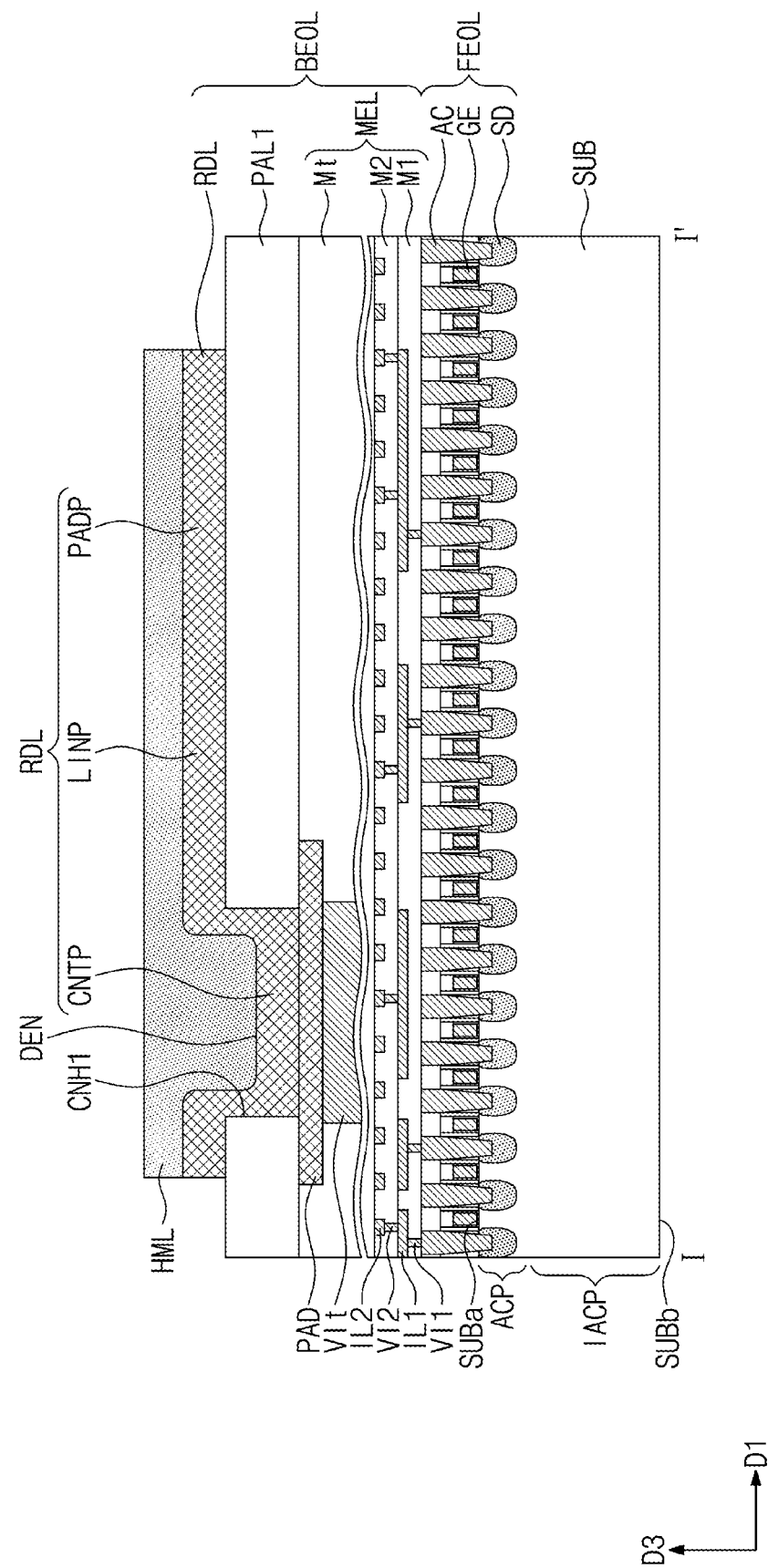

Referring to FIG. 7, a hardmask pattern HML may be formed on the conductive layer MtL. The hardmask pattern HML may be formed by utilizing a photolithography process. The hardmask pattern HML may be used as an etching mask to pattern the conductive layer MtL to form a redistribution line RDL.

A dry etching process may be used to form the redistribution line RDL. For example, boron trichloride ($BCl_3$), sulfur hexafluoride ($SF_6$), or a combination thereof may be used as an etching gas for the dry etching process. The redistribution line RDL may include a contact part CNTP in the first contact hole CNH1, a pad part PADP, and a line part LINP that extends from the contact part CNTP toward the pad part PADP. The line part LINP may physically and electrically connect the contact part CNTP to the pad part PADP.

Referring back to FIG. 4, the second region RG2 of the first dielectric layer PAL1 may be over-etched during the dry etching process for forming the redistribution line RDL. Therefore, a third recess RS3 may be formed in an upper portion on the second region RG2 of the first dielectric layer PAL1. The third recess RS3 may have a bottom surface lower than a top surface TS2 of the first region RG1 of the first dielectric layer PAL1.

During the dry etching process, an inclined first sidewall SW1 may be formed at an end of the redistribution line RDL. During the dry etching process, a second sidewall SW2 may be formed between the first and second regions RG1 and RG2 of the first dielectric layer PAL1. The first and second sidewalls SW1 and SW2 may be formed to have respective slopes different from each other.

Figure 8:
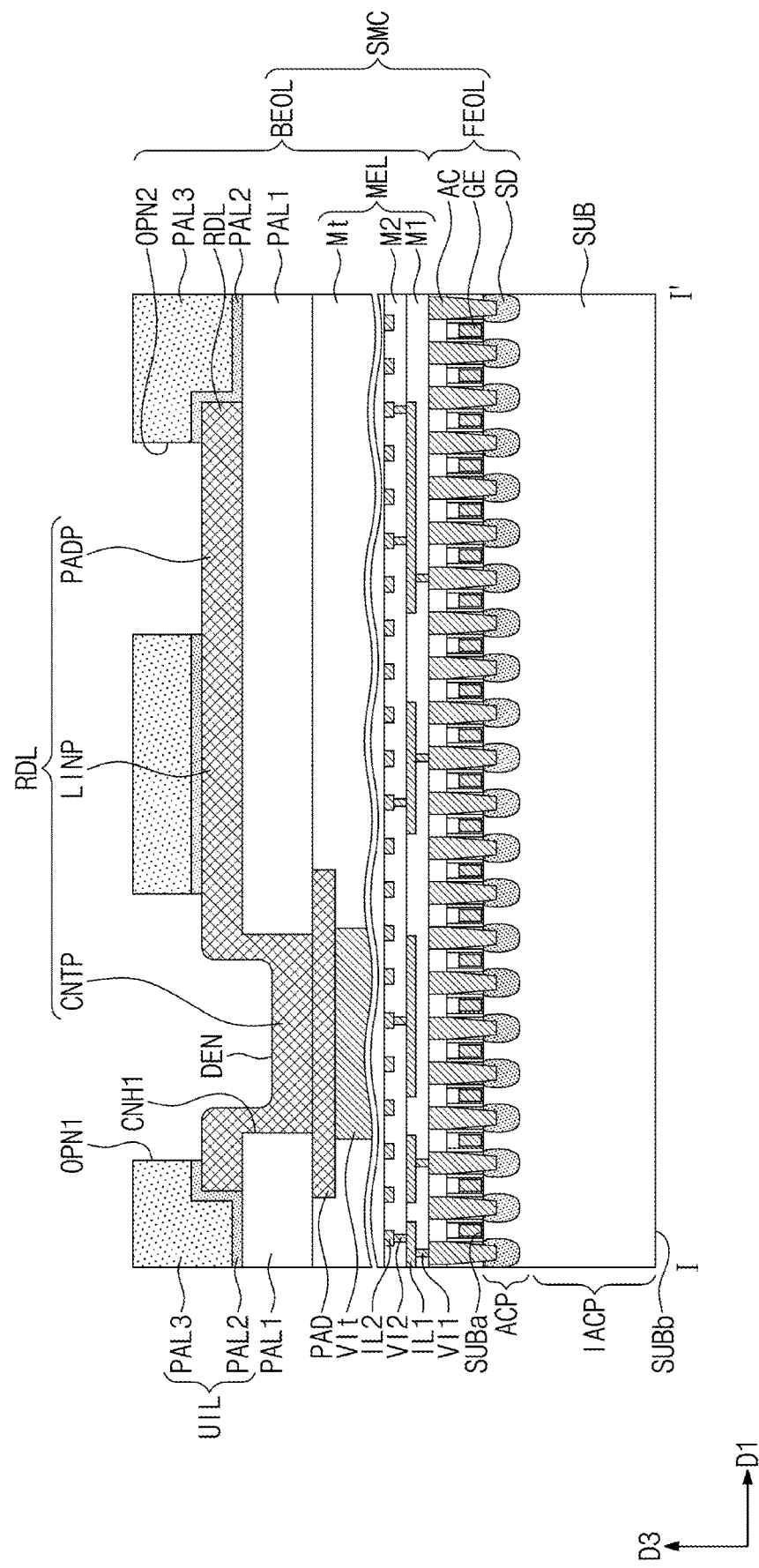

Referring to FIG. 8, the hardmask pattern HML may be selectively removed. The back-end-of-line process for a semiconductor chip may form a second dielectric layer PAL2 on the redistribution line RDL and the first dielectric layer PAL1. A third dielectric layer PAL3 may be formed on the second dielectric layer PAL2. The second and third dielectric layers PAL2 and PAL3 may constitute an upper dielectric layer UIL.

The second dielectric layer PAL2 may be formed by using atomic layer deposition (ALD) or chemical vapor deposition (CVD). The third dielectric layer PAL3 may be formed by coating on the second dielectric layer PAL2 a polymeric material, or a precursor thereof, such as polyimide, fluorocarbon, resin, and synthetic rubber.

The upper dielectric layer UIL may undergo a patterning process using photolithography to form a first opening OPN1 and a second opening OPN2. The first opening OPN1 may expose the contact part CNTP of the redistribution line RDL, and the second opening OPN2 may expose the pad part PADP of the redistribution line RDL.

As the upper dielectric layer UIL is formed which has the first and second openings OPN1 and OPN2, a semiconductor chip SMC may be eventually fabricated. For example, the formation of the upper dielectric layer UIL may complete the back-end-of-line structure for the semiconductor chip SMC. The fabricated semiconductor chip SMC may be fabricated out.

Figure 9:
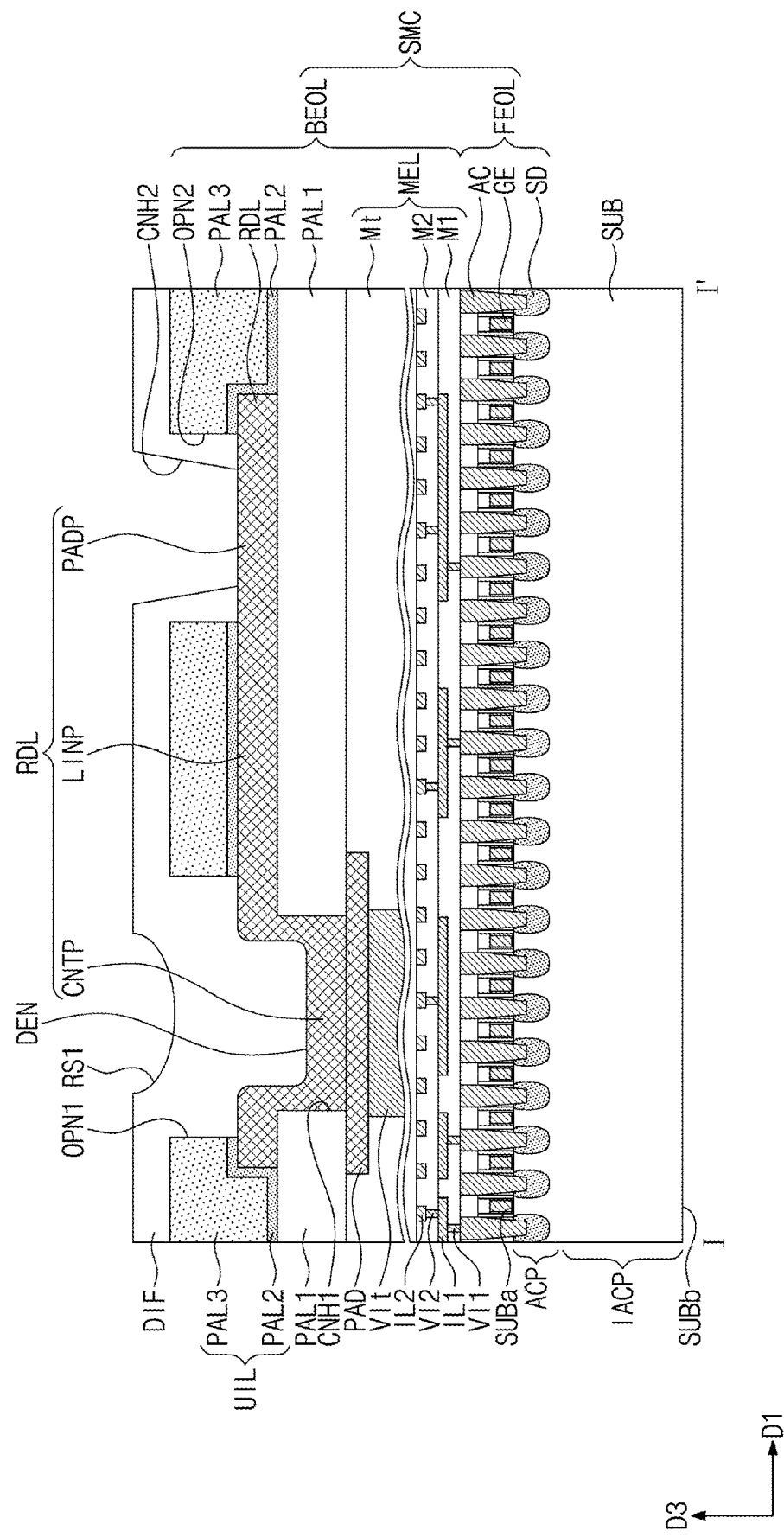

Referring to FIG. 9, the semiconductor chip SMC, which has been fabricated out, may undergo a Post-FAB process or a package process. For example, a dielectric film DIF may be formed on a back-end-of-line structure BEOL of the semiconductor chip SMC. The dielectric film DIF may be formed by coating an organic polymer material on the third dielectric layer PAL3. The redistribution line RDL may include a dent DEN on the contact part CNTP, and the dent DEN may result in formation of a first recess RS1 in a portion of a top surface of the dielectric film DIF.

The dielectric film DIF may undergo a patterning process using photolithography to form a second contact hole CNH2. The second contact hole CNH2 may be formed to penetrate the dielectric film DIF that fills the second opening OPN2. The second contact hole CNH2 may expose at least a portion of a top surface of the pad part PADP included in the redistribution line RDL.

Referring back to FIG. 3, the Post-FAB process may form an external connection member ECT. For example, a seed pattern BM may be formed on the second contact hole CNH2. A plating process may be performed to form a conductive pattern FM on the seed pattern BM. The seed pattern BM and the conductive pattern FM may constitute an under-bump pattern BMP. A solder-ball attachment process may be performed to form a solder pattern SLD on the under-bump pattern BMP.

When a Post-FAB process is employed to form the redistribution line RDL as a comparative example of the present inventive concepts, it may be required that a plating process uses copper to form the redistribution line RDL. When the redistribution line RDL is formed by the plating process, there may be problems such as a reduction in reliability and a requirement of additional wiring process, compared to some example embodiments of the present inventive concepts.

In a method of fabricating a wafer level package according to some example embodiments of the present inventive concepts, instead of a plating process that uses gold or copper, a deposition process that uses relatively inexpensive aluminum may be adopted to perform an In-FAB process to form the redistribution line RDL. Therefore, the present inventive concepts may be more economical than the comparative example that uses a plating process. Moreover, because the redistribution line RDL is formed by using deposition and patterning processes in place of a plating process, it may be possible to use back-end-of-line process and facilities for semiconductor chips. Accordingly, it may also be possible to achieve an effective method of fabricating a semiconductor chip and a wafer level package.

Figure 10:
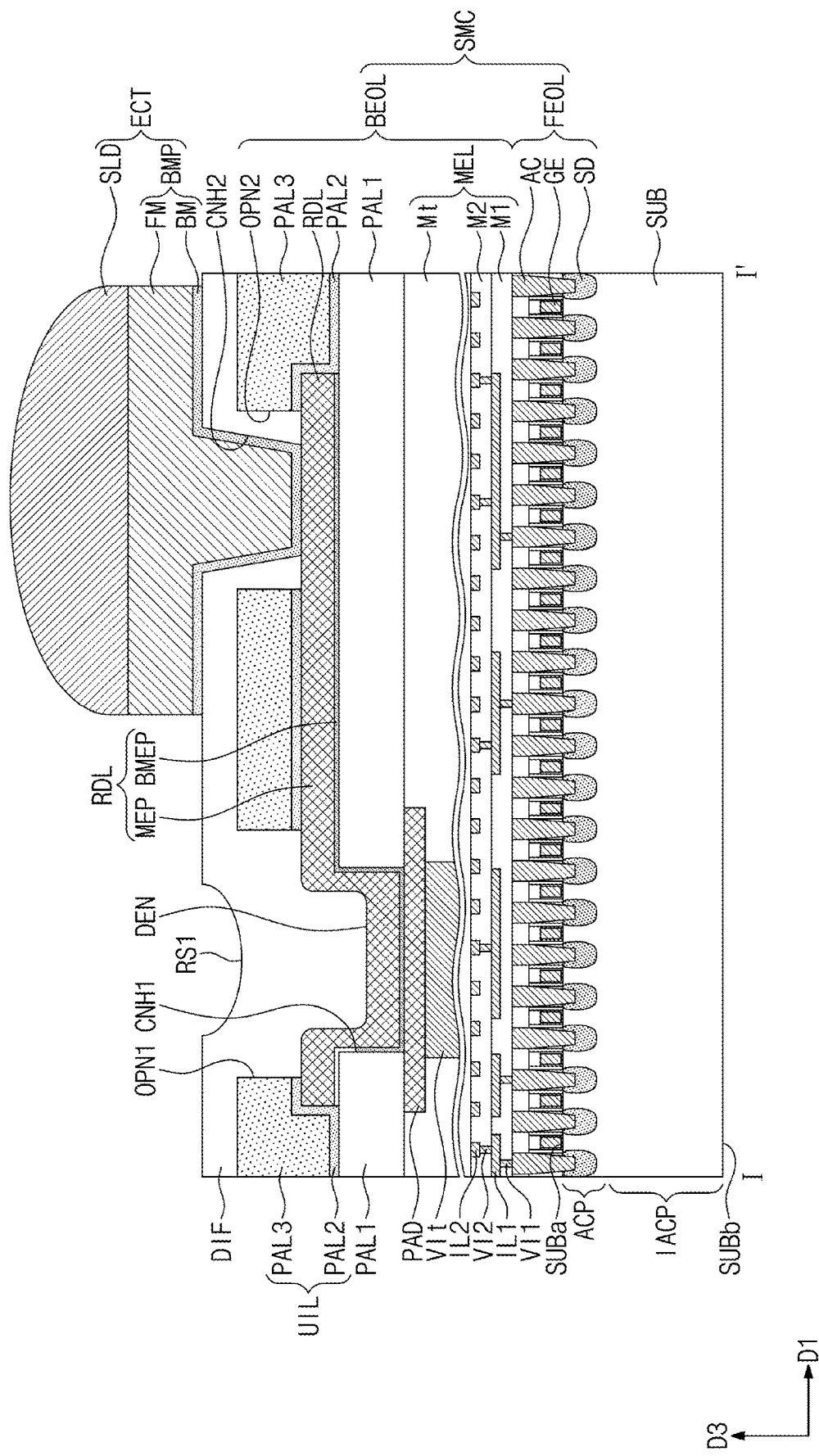
FIGS. 10, 11, and 12 illustrate cross-sectional views taken along line I-I' of FIG. 2, showing a wafer level package according to some example embodiments of the present inventive concepts.
Figure 11:
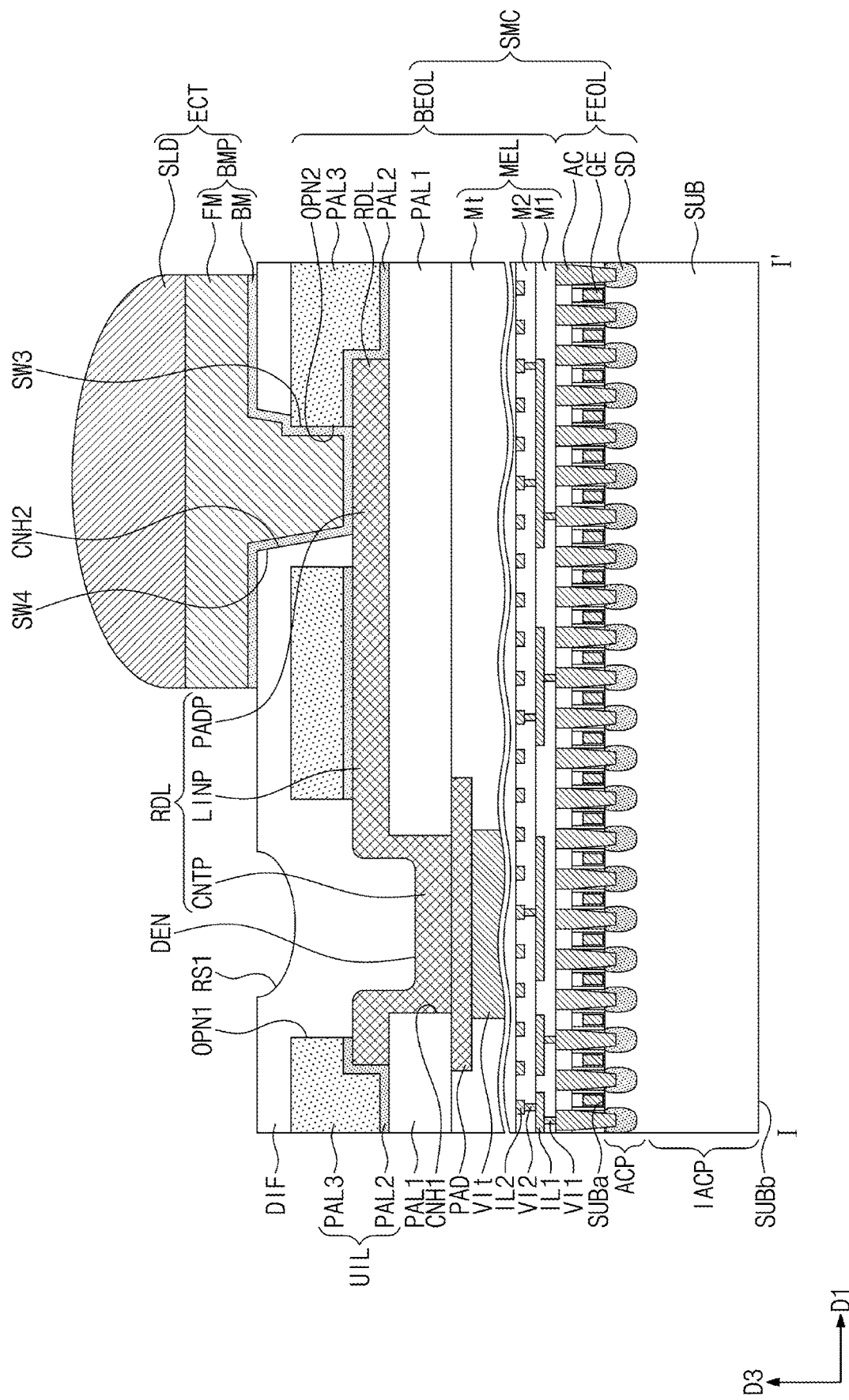
Figure 12:
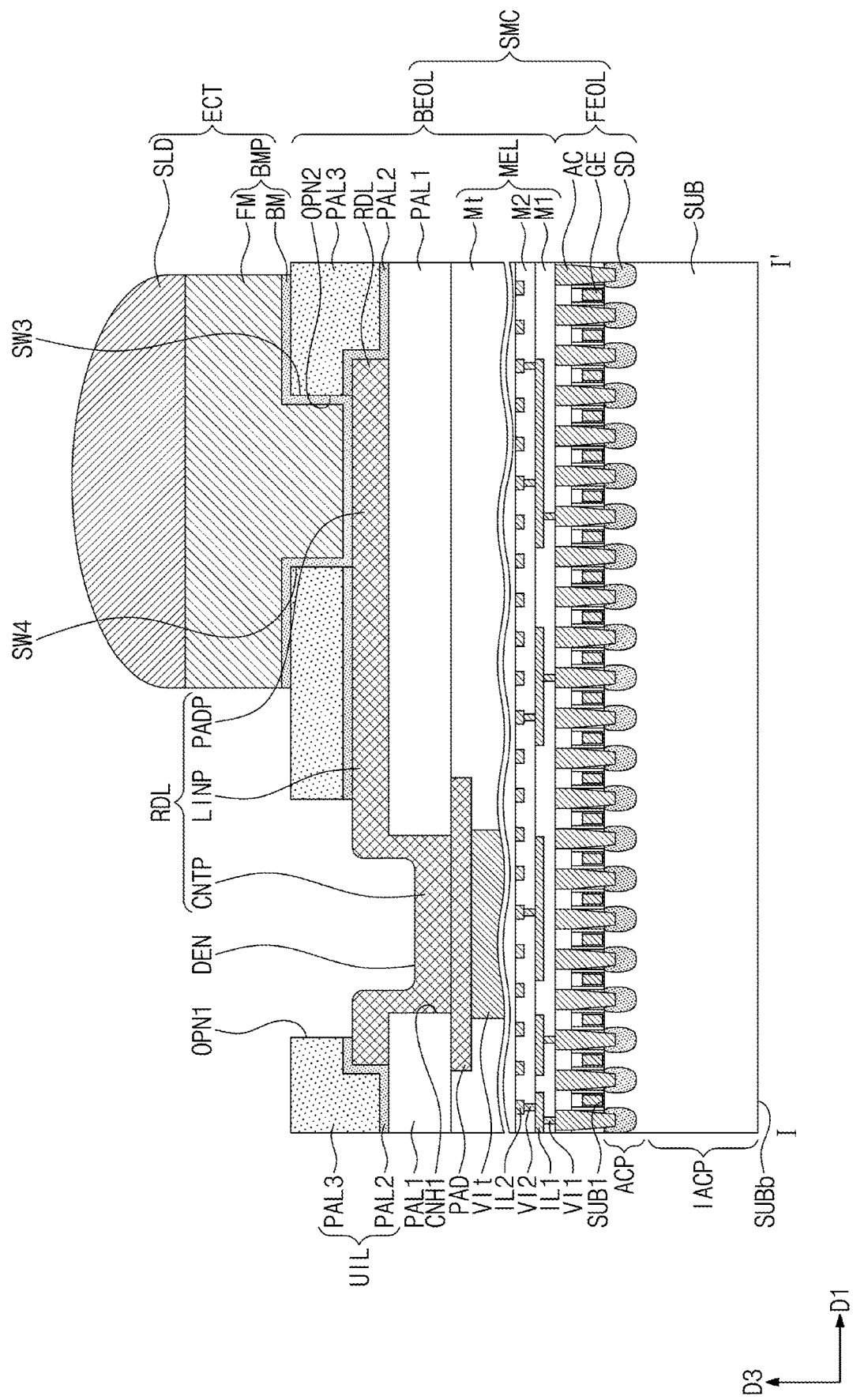

FIGS. 10, 11, and 12 illustrate cross-sectional views taken along line I-I' of FIG. 2, showing a wafer level package according to some example embodiments of the present inventive concepts. In the embodiment that follows, a detailed description of technical features repetitive to those discussed with reference to FIGS. 1 to 4 will be omitted, and a difference thereof will be discussed in detail.

Referring to FIG. 10, the redistribution line RDL may include a barrier pattern BMEP and a metal pattern MEP on the barrier pattern BMEP. The barrier pattern BMEP may be interposed between the first dielectric layer PAL1 and the metal pattern MEP. The barrier pattern BMEP may cover a bottom surface of the metal pattern MEP. The barrier pattern BMEP may vertically overlap the metal pattern MEP. For example, the metal pattern MEP and the barrier pattern BMEP may have respective sidewalls that are aligned with each other.

The barrier pattern BMEP may prevent/impede a metallic material from diffusing from the metal pattern MEP toward the first dielectric layer PAL1. For example, the barrier pattern BMEP may include titanium (Ti), titanium nitride (TiN), or a combination thereof. The barrier pattern BMEP may increase adhesion between the redistribution line RDL and the first dielectric layer PAL1.

Referring to FIG. 11, the second contact hole CNH2 may expose at least one sidewall of the upper dielectric layer UIL. The under-bump pattern BMP may include a lower portion provided in the second contact hole CNH2, and the lower portion may have a third sidewall SW3 and a fourth sidewall SW4. The third sidewall SW3 may be in direct contact with a sidewall of the upper dielectric layer UIL exposed to the second contact hole CNH2. The fourth sidewall SW4 may be spaced apart from the upper dielectric layer UIL across the dielectric film DIF. Because the third sidewall SW3 of the under-bump pattern BMP is in contact with the upper dielectric layer UIL, and because the fourth sidewall SW4 of the under-bump pattern BMP is in contact with the dielectric film DIF, the under-bump pattern BMP may improve in structural stability and accordingly a package may increase in reliability.

Referring to FIG. 12, the dielectric film DIF may be omitted. A lower portion of the under-bump pattern BMP may fill the second opening OPN2. The under-bump pattern BMP may be connected through the second opening OPN2 to the redistribution line RDL. The lower portion of the under-bump pattern BMP may have a third sidewall SW3 and a fourth sidewall SW4 that are opposite to each other. Each of the third and fourth sidewalls SW3 and SW4 may be in direct contact with a sidewall of the upper dielectric layer UIL. Because the dielectric film DIF is omitted, an enlarged contact area may be provided between the under-bump pattern BMP and the redistribution line RDL. Therefore, the under-bump pattern BMP and the pad part PADP of the redistribution line RDL may have therebetween a low resistance to increase electrical properties.

Figure 13:
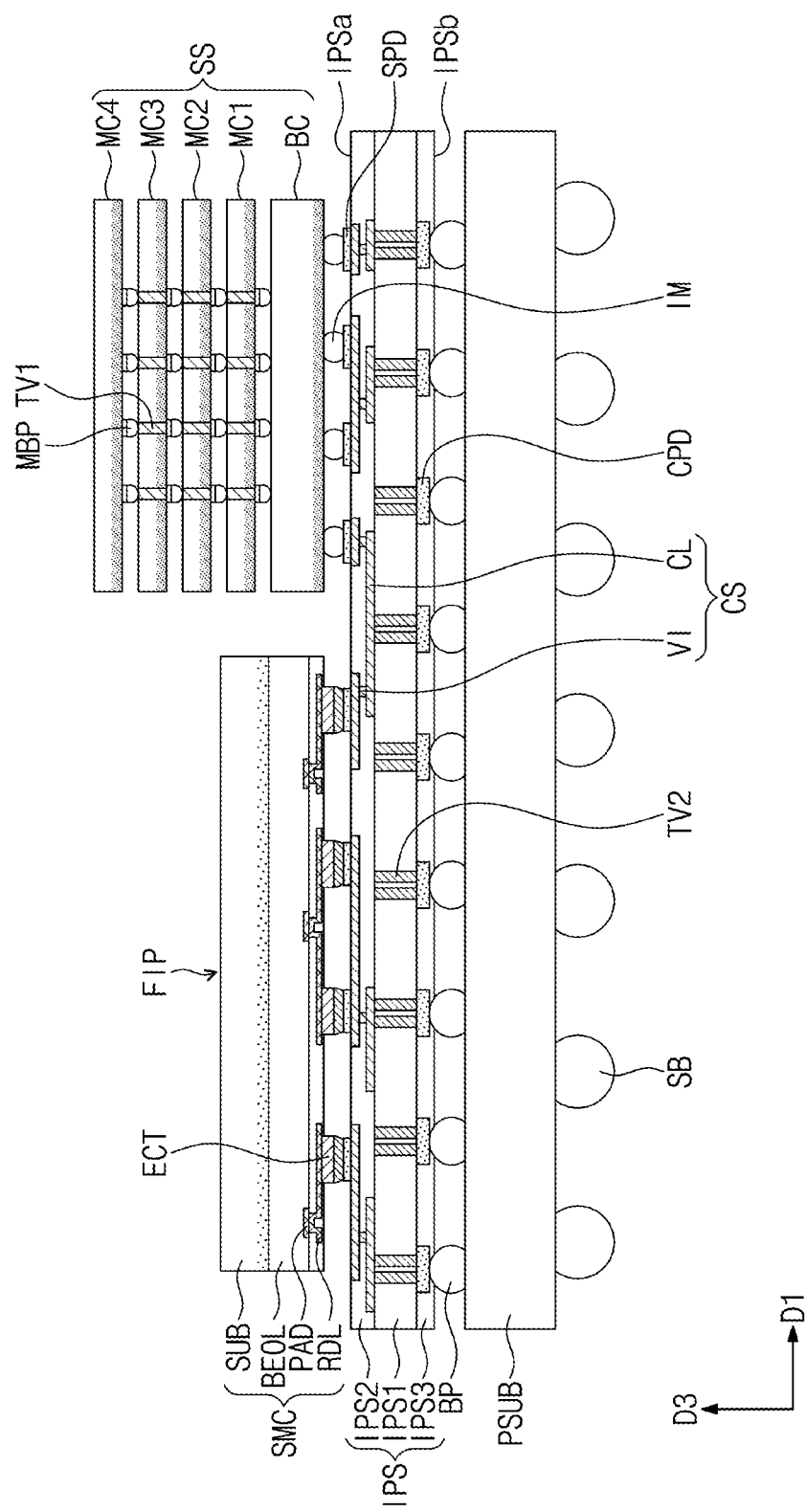
FIGS. 13, 14, and 15 illustrate cross-sectional views showing a semiconductor package including a wafer level package according to some example embodiments of the present inventive concepts.
Figure 14:
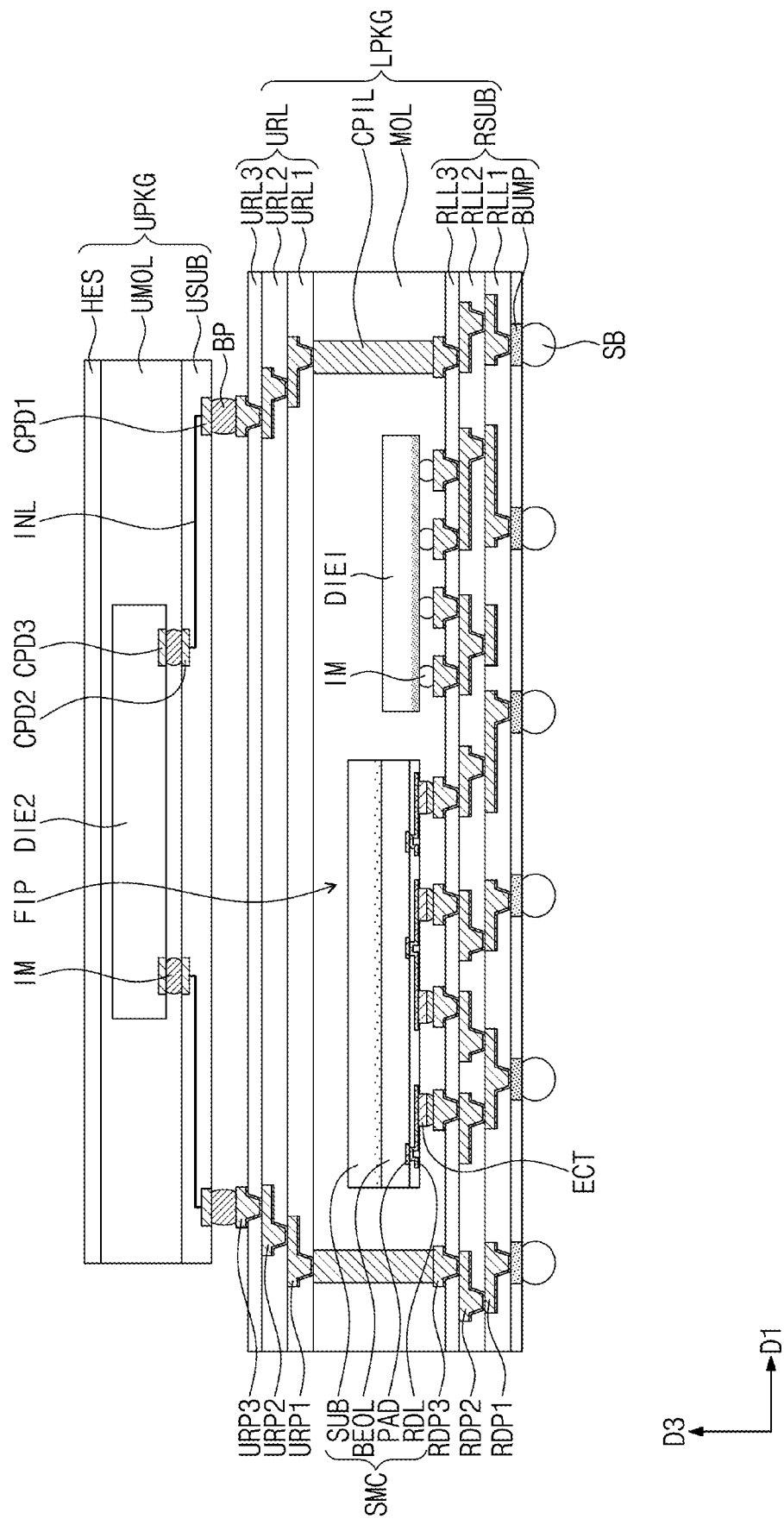
Figure 15:
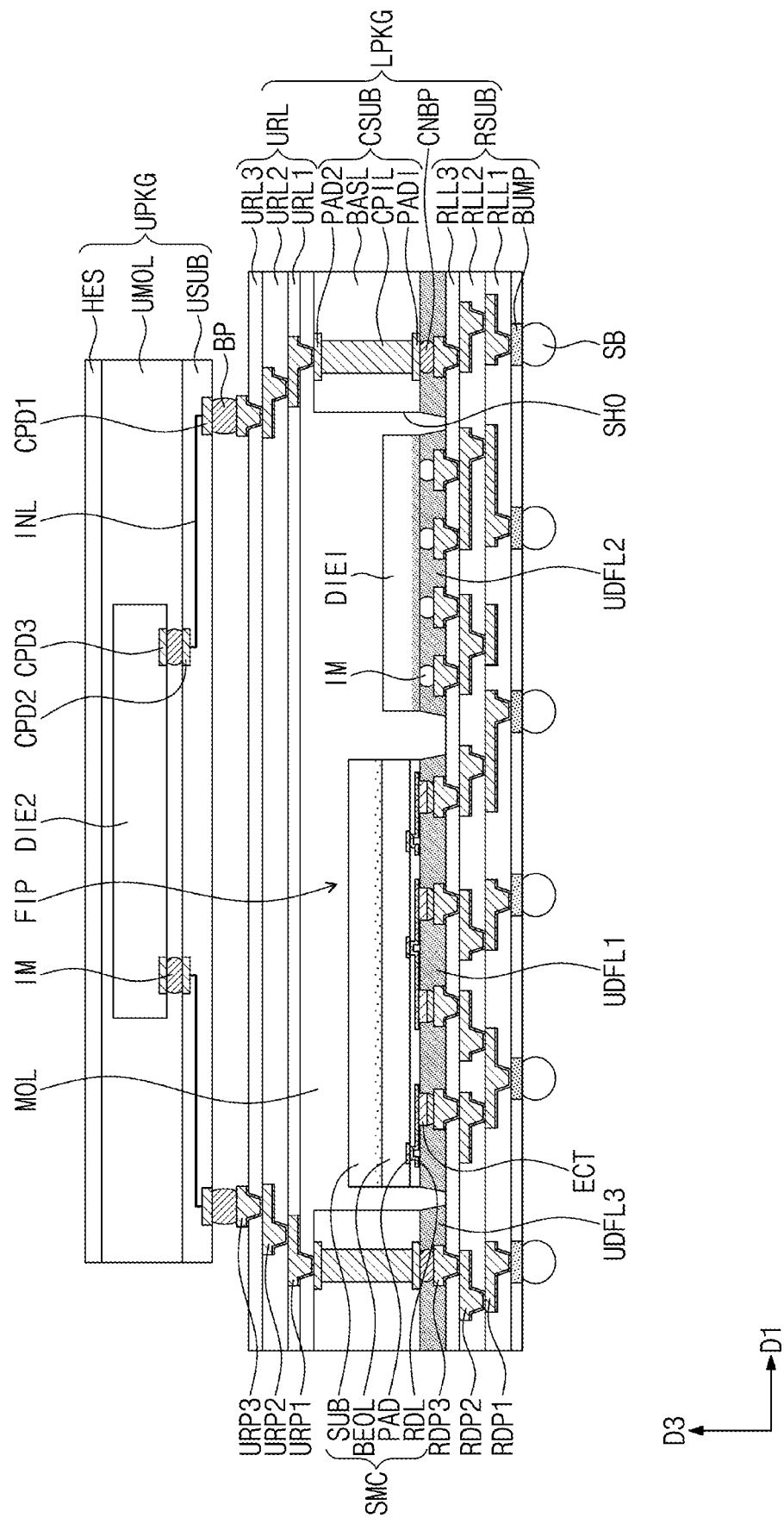

FIGS. 13, 14, and 15 illustrate cross-sectional views showing a semiconductor package including a wafer level package according to some example embodiments of the present inventive concepts.

Referring to FIG. 13, a package substrate PSUB may be provided. An interposer substrate IPS may be provided on the package substrate PSUB. For example, the package substrate PSUB may be a printed circuit board (PCB).

The interposer substrate IPS may have a first surface IPSa and a second surface IPSb opposite to the first surface IPSa. The second surface IPSb may face the package substrate PSUB. First external terminals BP may be provided on the second surface IPSb of the interposer substrate IPS. The first external terminals BP may be interposed between the interposer substrate IPS and the package substrate PSUB. For example, the first external terminals BP may include bumps.

Second external terminals SB may be provided on a bottom surface of the package substrate PSUB. The second external terminals SB may include solder balls. Although not shown, the package substrate PSUB may include therein routing lines and at least one via.

The interposer substrate IPS may be provided on its first surface IPSa with a memory stack structure SS and a wafer level package FIP according to some example embodiments of the present inventive concepts. The semiconductor chip SMC of the wafer level package FIP may be a logic chip, such as SOC. The wafer level package FIP and the memory stack structure SS may be mounted side by side in a first direction D1 on the interposer substrate IPS.

The memory stack structure SS may include a buffer die BC and first to fourth memory dies MC1 to MC4 that are sequentially stacked on the buffer die BC. The buffer die BC may be mounted on the interposer substrate IPS such that the buffer die BC may have a facedown state in which its active layer faces the interposer substrate IPS.

The first to fourth memory dies MC1 to MC4 may be dynamic random access memory (DRAM) chips. Each of the first, second, and third memory dies MC1, MC2, and MC3 may include first through vias TV1 that penetrate therethrough. The fourth memory die MC4 may not include the first through via TV1. Micro-bumps MBP may be provided between the buffer die BC and the first memory die MC1, between the first memory die MC1 and the second memory die MC2, between the second memory die MC2 and the third memory die MC3, and between the third memory die MC3 and the fourth memory die MC4.

The micro-bumps MBP may be electrically connected to the first through vias TV1 of the first, second, and third memory dies MC1, MC2, and MC3. The first to fourth memory dies MC1 to MC4 may be electrically connected to the buffer die BC through the first through vias TV1 and the micro-bumps MBP.

Signal pads SPD may be provided on the first surface IPSa of the interposer substrate IPS. The external connection members ECT of the wafer level package FIP may be disposed on corresponding signal pads SPD. The wafer level package FIP and the interposer substrate IPS may be electrically connected to each other through the external connection members ECT and the signal pads SPD.

Connection terminals IM may be interposed between the memory stack structure SS and corresponding signal pads SPD. The memory stack structure SS and the interposer substrate IPS may be electrically connected to each other through the connection terminals IM and the signal pads SPD. For example, the connection terminals IM may include micro-bumps.

Although not shown, an under-fill resin layer may fill a space between the wafer level package FIP and the interposer substrate IPS and a space between the memory stack structure SS and the interposer substrate IPS.

The interposer substrate IPS may include a first layer IPS1, a second layer IPS2 on the first layer IPS1, and a third layer IPS3 below the first layer IPS1. The first layer IPS1 may be interposed between the second and third layers IPS2 and IPS3.

A conductive structure CS may be provided in the second layer IPS2. The conductive structure CS may include a plurality of conductive lines CL and a plurality of vias VI. Each via VI may connect a conductive line CL at an upper position to another conductive line CL at a lower position. The conductive structure CS may electrically connect signal pads SPD below the wafer level package FIP to signal pads SPD below the memory stack structure SS.

Conductive pads CPD may be provided in the third layer IPS3. The third layer IPS3 may cover the conductive pads CPD. First external terminals BP may be provided on corresponding conductive pads CPD. For example, the first external terminal BP may be interposed between the conductive pad CPD and the package substrate PSUB.

Second through vias TV2 may be provided in the first layer IPS1. The second through vias TV2 may penetrate the first layer IPS1. The second through vias TV2 may electrically connect the conductive structure CS to the conductive pads CPD.

Referring to FIG. 14, a semiconductor package according to some example embodiments of the present inventive concepts may include a lower semiconductor package LPKG and an upper semiconductor package UPKG. The lower semiconductor package LPKG may include a redistribution substrate RSUB, second external terminals SB, connection terminals IM, a wafer level package FIP according to some example embodiments of the present inventive concepts, a first die DIE1, a molding layer MOL, conductive pillars CPIL, and an upper redistribution layer URL. The conductive pillars CPIL may comprise a conductive structure that is not limited to a pillar structure/shape.

The redistribution substrate RSUB may include a first redistribution layer RLL1, a second redistribution layer RLL2, and a third redistribution layer RLL3 that are sequentially stacked. The first redistribution layer RLL1 may include first redistribution patterns RDP1. The second redistribution layer RLL2 may include second redistribution patterns RDP2. The third redistribution layer RLL3 may include lower bonding pads RDP3. Each of the lower bonding pads RDP3 may have an upper portion that protrudes upwardly from the third redistribution layer RLL3. Similar to the under-bump pattern BMP of FIG. 3, the first redistribution patterns RDP1, the second redistribution patterns RDP2, and the lower bonding pads RDP3 may each include a seed pattern and a conductive pattern on the seed pattern.

A plurality of bump patterns BUMP may be provided below the first redistribution layer RLL1. The bump patterns BUMP may be connected to corresponding first redistribution patterns RDP1. A plurality of second external terminals SB may be provided below corresponding bump patterns BUMP. The bump pattern BUMP may lie between and connect the second external terminal SB and the first redistribution pattern RDP1. For example, the second external terminal SB may be a solder ball.

The redistribution substrate RSUB may be provided thereon with a first die DIE1 and the wafer level package FIP according to some example embodiments of the present inventive concepts. The wafer level package FIP and the first die DIE1 may be mounted side by side in a first direction D1 on the redistribution substrate RSUB.

The first die DIE1 may be of a different type from that of the semiconductor chip SMC included in the wafer level package FIP. For example, the first die DIE1 may include one of a logic chip, a memory chip, and a power management chip, and the wafer level package FIP may include another of a logic chip, a memory chip, and a power management chip.

Differently from that shown, the first die DIE1 may be omitted. For another example, an additional die (or a semiconductor chip) may be mounted on the redistribution substrate RSUB.

The external connection members ECT of the wafer level package FIP may be disposed on corresponding lower bonding pads RDP3 of the redistribution substrate RSUB. As the external connection members ECT are connected to the corresponding lower bonding pads RDP3, the wafer level package FIP and the redistribution substrate RSUB may be electrically connected to each other.

The connection terminals IM may be interposed between the first die DIE1 and the lower bonding pads RDP3 of the redistribution substrate RSUB. The first die DIE1 and the redistribution substrate RSUB may be electrically connected to each other through the connection terminals IM. For example, the connection terminals IM may include microbumps.

At least one conductive pillar CPIL may be provided on the redistribution substrate RSUB. The conductive pillar CPIL may be provided on an edge area of the redistribution substrate RSUB. The conductive pillar CPIL may be horizontally spaced apart from the wafer level package FIP and the first die DIE1.

The conductive pillar CPIL may be connected to a corresponding lower bonding pad RDP3. In this case, the conductive pillar CPIL may be electrically connected to the redistribution substrate RSUB. For example, the conductive pillar CPIL may be electrically connected through the redistribution substrate RSUB to one of the wafer level package FIP, the first die DIEL and the second external terminal SB. The conductive pillar CPIL may be a metallic column including metal such as copper.

The redistribution substrate RSUB may be provided thereon with the molding layer MOL that covers the wafer level package FIP and the first die DIE1. The molding layer MOL may cover a sidewall of the conductive pillar CPIL. The molding layer MOL may have a sidewall aligned with that of the redistribution substrate RSUB. The molding layer MOL may expose a top surface of the conductive pillar CPIL. For example, the molding layer MOL may include a dielectric polymer, such as an epoxy-based molding compound.

The upper redistribution layer URL may be provided on a top surface of the molding layer MOL. The upper redistribution layer URL may include a first upper redistribution layer URL1, a second upper redistribution layer URL2, and a third upper redistribution layer URL3.

The first upper redistribution layer URL1 may include first upper redistribution patterns URP1. The second upper redistribution layer URL2 may include second upper redistribution patterns URP2. The third upper redistribution layer URL3 may include upper bonding pads URP3. The first upper redistribution pattern URP1 may be connected to the top surface of the conductive pillar CPIL. Each of the upper bonding pads URP3 may protrude upwardly from the third upper redistribution layer URL3. Similar to the under-bump pattern BMP of FIG. 3, the first upper redistribution patterns URP1, the second upper redistribution patterns URP2, and the upper bonding pads URP3 may each include a seed pattern and a conductive pattern on the seed pattern.

The upper bonding pads URP3 may be electrically connected through the first and second upper redistribution patterns URP1 and URP2 and the conductive pillars CPIL to the wafer level package FIP, the first die DIE1, or the second external terminals SB. As the first and second upper redistribution patterns URP1 and URP2 are provided, the upper bonding pad URP3 may be disposed offset from the conductive pillar CPIL.

The upper semiconductor package UPKG may be provided on the lower semiconductor package LPKG. For example, the upper semiconductor package UPKG may be mounted on the upper redistribution layer URL. The upper semiconductor package UPKG may include an upper substrate USUB, a second die DIE2, and an upper molding layer UMOL. For example, the upper substrate USUB may be a printed circuit board. For another example, the upper substrate USUB may be a redistribution substrate such as the redistribution substrate RSUB of the lower semiconductor package LPKG.

A first conductive pad CPD1 and a second conductive pad CPD2 may be respectively disposed on a bottom surface and a top surface of the upper substrate USUB. The upper substrate USUB may have therein a wiring line INL coupled to the first and second conductive pad CPD1 and CPD2. The wiring line INL is schematically illustrated and may be variously changed in shape and arrangement. The first conductive pad CPD1, the second conductive pad CPD2, and the wiring line INL may include a conductive material, such as metal.

The second die DIE2 may be disposed on the upper substrate USUB. The second die DIE2 may include an integrated circuit (not shown), and the integrated circuit may include a memory circuit, a logic circuit, or a combination thereof. The second die DIE2 may be of a different type from those of the wafer level package FIP and the first die DIE1. For example, the second die DIE2 may be a memory chip. The second conductive pad CPD2 and the second die DIE2 may have therebetween a connection terminal IM that connects the upper substrate USUB to the second die DIE2. The second die DIE2 may be electrically connected to the first conductive pad CPD1 through the connection terminal IM and the wiring line INL.

The upper substrate USUB may be provided thereon with the upper molding layer UMOL that covers the second die DIE2. The upper molding layer UMOL may include a dielectric polymer, such as an epoxy-based polymer.

The upper semiconductor package UPKG may further include a thermal radiation structure HES. The thermal radiation structure HES may include a heat sink, a heat slug, or a thermal interface material layer. For example, the thermal radiation structure HES may include metal. The thermal radiation structure HES may be disposed on a top surface of the upper molding layer UMOL. The thermal radiation structure HES may further extend onto a sidewall of the upper molding layer UMOL.

First external terminals BP may be provided between the lower semiconductor package LPKG and the upper semiconductor package UPKG. The first external terminal BP may be interposed between the upper bonding pad URP3 and the first conductive pad CPD1, thereby connecting the lower semiconductor package LPKG to the upper semiconductor package UPKG. For example, the upper semiconductor package UPKG may be electrically connected through the first external terminals BP to the wafer level package FIP, the first die DIE1, or the second external terminals SB. An electrical connection with the upper semiconductor package UPKG may mean an electrical connection with an integrated circuit in the second die DIE2. The first external terminal BP may include a solder, a bump, or a combination thereof. The first external terminal BP may include a solder material.

Referring to FIG. 15, a semiconductor package according to some example embodiments of the present inventive concepts may include a lower semiconductor package LPKG and an upper semiconductor package UPKG. The lower semiconductor package LPKG may include a redistribution substrate RSUB, second external terminals SB, connection terminals IM, connection bumps CNBP, a wafer level package FIP according to some example embodiments of the present inventive concepts, a first die DIE1, a molding layer MOL, and a connection substrate CSUB. The redistribution substrate RSUB, the second external terminals SB, the connection terminals IM, and the molding layer MOL may be identical or similar to those discussed above with reference to FIG. 14.

The lower semiconductor package LPKG may further include a first under-fill layer UDFL1 and a second under-fill layer UDFL2. The first under-fill layer UDFL1 may be provided in a first gap between the redistribution substrate RSUB and the wafer level package FIP. The first under-fill layer UDFL1 may seal the external connection members ECT. The second under-fill layer UDFL2 may be provided in a second gap between the redistribution substrate RSUB and the first die DIE1, thereby sealing the connection terminals IM.

The connection substrate CSUB may be disposed on the redistribution substrate RSUB. The connection substrate CSUB may have a substrate hole SHO that penetrates therethrough. For example, the connection substrate CSUB may be fabricated by forming the substrate hole SHO that penetrates top and bottom surfaces of a printed circuit board. When viewed in plan, the substrate hole SHO may overlap a central portion of the redistribution substrate RSUB. The wafer level package FIP and the first die DIE1 may be disposed in the substrate hole SHO of the connection substrate CSUB. The wafer level package FIP and the first die DIE1 may be spaced apart from an inner wall of the connection substrate CSUB.

The connection substrate CSUB may include a base layer BASL and a conductive pillar CPIL. The base layer BASL may include a single layer or a multiple layer. The base layer BASL may include a dielectric material. For example, the base layer BASL may include a carbon-based material, a ceramic, or a polymer. The conductive pillar CPIL may be provided in the base layer BASL. The connection substrate CSUB may further include a first pad PAD1 and a second pad PAD2. The first pad PAD1 may be disposed on a bottom surface of the conductive pillar CPIL. The second pad PAD2 may be disposed on a top surface of the conductive pillar CPIL. The second pad PAD2 may be electrically connected through the conductive pillar CPIL to the first pad PAD1. For example, the conductive pillar CPIL, the first pad PAD1, and the second pad PAD2 may each include at least one selected from copper, aluminum, tungsten, titanium, tantalum, iron, and any alloy thereof.

The connection bump CNBP may be disposed between the redistribution substrate RSUB and the connection substrate CSUB. The connection bump CNBP may be interposed between the first pad PAD1 and its corresponding lower bonding pad RDP3, thereby connecting the connection substrate CSUB to the redistribution substrate RSUB.

The conductive pillar CPIL may be electrically connected through the connection bump CNBP to the redistribution substrate RSUB. The connection bump CNBP may include one or more of a solder ball, a bump, and a pillar. The connection bump CNBP may include a metallic material.

A third under-fill layer UDFL3 may be interposed between the redistribution substrate RSUB and the connection substrate CSUB, thereby sealing the connection bump CNBP. The third under-fill layer UDFL3 may include a dielectric polymer.

The molding layer MOL may be provided on the connection substrate CSUB. The molding layer MOL may cover the wafer level package FIP and the first die DIE1, while filling the substrate hole SHO. The molding layer MOL may be interposed between the wafer level package FIP and the first die DIE1, between the wafer level package FIP and the connection substrate CSUB, and between the first die DIE1 and the connection substrate CSUB.

In some example embodiments, an adhesive dielectric film may be attached to a top surface of the connection substrate CSUB, top surfaces of the wafer level package FIP and the first die DIE1, sidewalls of the wafer level package FIP, and sidewalls of the first die DIE1, with the result that the molding layer MOL may be formed. For example, an Ajinomoto build-up film (ABF) may be used as the adhesive dielectric film. For another example, the molding layer MOL may include a dielectric polymer, such as an epoxy-based polymer. For another example, the first and second under-fill layers UDFL1 and UDFL2 may be omitted, and the molding layer MOL may further extend onto a bottom surface of the wafer level package FIP and a bottom surface of the first die DIE1. When the third under-fill layer UDFL3 is omitted, the molding layer MOL may further extend into a gap between the redistribution substrate RSUB and the connection substrate CSUB.

The lower semiconductor package LPKG may further include an upper redistribution layer URL. The upper redistribution layer URL may be disposed on the molding layer MOL and the connection substrate CSUB. The upper redistribution layer URL may be identical or similar to the upper redistribution layer URL discussed above with reference to FIG. 14.

The upper semiconductor package UPKG may be provided on the lower semiconductor package LPKG. For example, the upper semiconductor package UPKG may be mounted on the upper redistribution layer URL. The upper semiconductor package UPKG may include an upper substrate USUB, a second die DIE2, and an upper molding layer UMOL. The upper semiconductor package UPKG and the first external terminal BP may be substantially the same as those discussed above with reference to FIG. 14. For example, the first external terminal BP may be interposed between the lower semiconductor package LPKG and the upper semiconductor package UPKG. The upper semiconductor package UPKG may further include a thermal radiation structure HES.

According to the present inventive concepts, a redistribution line of a wafer level package may be formed by an In-FAB process, for example, a back-end-of-line process for a semiconductor chip. As the redistribution line of the wafer level package is formed by using a semiconductor chip fabrication process, the redistribution line may be formed in an In-FAB process without additional equipment investment. In conclusion, it may be possible to achieve an effective and economical method of fabricating the wafer level package.

According to the present inventive concepts, it may also be possible to structurally stably form the redistribution line of the wafer level package and an under-bump pattern on the redistribution line. As a result, a package may increase in reliability and electrical properties.

Although some example embodiments of inventive concepts have been discussed with reference to accompanying figures, it will be understood that various changes in form and details may be made therein without departing from the scope of the inventive concepts. It therefore will be understood that the embodiments described above are just illustrative but not limitative in all aspects.

What is claimed is:

1. A semiconductor package comprising:
a package substrate;
an interposer substrate on the package substrate;
a wafer level package on the interposer substrate; and
a memory stack structure on the interposer substrate and mounted side by side with the wafer level package,
wherein the wafer level package comprises a semiconductor chip and an external connection member between the semiconductor chip and the interposer substrate,
wherein the semiconductor chip includes a substrate, a front-end-of-line structure on the substrate, and a back-end-of-line structure on the front-end-of-line structure,
wherein the back-end-of-line structure includes:
a plurality of metal layers stacked on the front-end-of-line structure, an uppermost metal layer of the metal layers including a pad therein;
a redistribution line on the pad, the redistribution line being configured to electrically connect the pad and the external connection member; and
a first dielectric layer between the uppermost metal layer and the redistribution line,
wherein the first dielectric layer includes a first region and a second region beside the first region, the first region vertically overlapping the redistribution line,
wherein the redistribution line includes a first sidewall at an end thereof,
wherein the second region includes a first recess in an upper portion thereof, an inner wall of the first recess including a second sidewall connected to the first sidewall, and
wherein a slope of the first sidewall is different from a slope of the second sidewall.

2. The semiconductor package of claim 1,
wherein the wafer level package further comprises a dielectric film between the semiconductor chip and the external connection member,
wherein the redistribution line includes a dent in a contact part thereof that connects to the pad,
wherein the dielectric film includes a second recess in a top surface thereof, and
wherein the second recess vertically overlaps the dent.

3. The semiconductor package of claim 1,
wherein the substrate has a first surface and a second surface opposite to the first surface,
wherein the substrate includes an active section adjacent to the first surface and an inactive section adjacent to the second surface, and
wherein the front-end-of-line structure includes a plurality of transistors and a plurality of contacts that are on the active section.

4. The semiconductor package of claim 1,
wherein the redistribution line includes a contact part electrically connected to the pad,
wherein the contact part has a first thickness in a vertical direction and a second thickness in a horizontal direction,
wherein the first thickness is greater than the second thickness, and
wherein the first thickness is in a range of about 1 micrometer (µm) to about 8 µm.

5. The semiconductor package of claim 1,
wherein the external connection member includes an under-bump pattern electrically connected to the redistribution line,
wherein the redistribution line includes a second recess in an upper portion thereof, and
wherein a lower portion of the under-bump pattern is in the second recess.

6. The semiconductor package of claim 5,
wherein the first recess has a first depth,
wherein the second recess has a second depth, and
wherein the first depth is greater than the second depth.

7. The semiconductor package of claim 1,
wherein the semiconductor chip further includes an upper dielectric layer on the redistribution line,
wherein the upper dielectric layer includes:
a second dielectric layer that is on the redistribution line and the first dielectric layer; and
a third dielectric layer on the second dielectric layer,
wherein the second dielectric layer includes an inorganic dielectric layer, and
wherein the third dielectric layer includes an organic polymer layer.

8. The semiconductor package of claim 7,
wherein a thickness of the second dielectric layer is substantially the same as or less than a depth of the first recess.

9. The semiconductor package of claim 7,
wherein the external connection member includes an under-bump pattern electrically connected to the redistribution line and a solder pattern on the under-bump pattern, and
wherein an upper portion of the under-bump pattern between the solder pattern and the upper dielectric layer has a height of about 20 micrometers (µm) to about 50 µm.

10. The semiconductor package of claim 1,
wherein the memory stack structure includes a buffer die and a plurality of memory dies that are stacked on the buffer die, and
wherein the buffer die is mounted on the interposer substrate.

11. A semiconductor package comprising:
a redistribution substrate;
a wafer level package on the redistribution substrate;
a molding layer on the redistribution substrate and covering the wafer level package;
an upper redistribution layer on the molding layer;
a conductive structure that vertically extends from the redistribution substrate toward the upper redistribution layer; and
an upper package on the upper redistribution layer,
wherein the wafer level package comprises a semiconductor chip and an external connection member between the semiconductor chip and the redistribution substrate, wherein the semiconductor chip includes a substrate, a front-end-of-line structure on the substrate, and a back-end-of-line structure on the front-end-of-line structure, wherein the back-end-of-line structure includes:
- a plurality of metal layers stacked on the front-end-of-line structure, an uppermost metal layer of the metal layers including a pad therein;
- a redistribution line on the pad, the redistribution line being configured to electrically connect the pad and the external connection member; and
- a first dielectric layer between the uppermost metal layer and the redistribution line, wherein the external connection member includes an under-bump pattern electrically connected to the redistribution line, wherein the redistribution line includes a first recess in an upper portion thereof, and wherein a lower portion of the under-bump pattern is in the first recess.

12. The semiconductor package of claim 11, wherein the semiconductor chip further includes an upper dielectric layer on the redistribution line, wherein the upper dielectric layer includes:
- a second dielectric layer that is on the redistribution line and the first dielectric layer; and
- a third dielectric layer on the second dielectric layer, wherein the second dielectric layer includes an inorganic dielectric layer, and wherein the third dielectric layer includes an organic polymer layer.

13. The semiconductor package of claim 12, wherein the external connection member further includes a solder pattern on the under-bump pattern, and wherein an upper portion of the under-bump pattern between the solder pattern and the upper dielectric layer has a height of about 20 micrometers (μm) to about 50 μm.

14. The semiconductor package of claim 11, wherein the first dielectric layer includes a first region and a second region beside the first region, the first region vertically overlapping the redistribution line, wherein the redistribution line includes a first sidewall at an end thereof, wherein the second region includes a first recess in an upper portion thereof, an inner wall of the first recess including a second sidewall connected to the first sidewall, and wherein a slope of the first sidewall is different from a slope of the second sidewall.

15. The semiconductor package of claim 11, wherein the upper package includes:
- an upper substrate;
- a die mounted on the upper substrate; and
- an upper molding layer on the upper substrate and covering the die.

16. A semiconductor package comprising:
- a redistribution substrate;
- a wafer level package on the redistribution substrate;
- a connection substrate on the redistribution substrate, the connection substrate including a substrate hole therein, the wafer level package being in the substrate hole;
- a molding layer on the connection substrate and the wafer level package;
- an upper redistribution layer on the molding layer;
- a conductive structure in the connection substrate, the conductive structure vertically extending from the redistribution substrate toward the upper redistribution layer; and
- an upper package on the upper redistribution layer, wherein the wafer level package comprises a semiconductor chip and an external connection member between the semiconductor chip and the redistribution substrate, wherein the semiconductor chip includes a substrate, a front-end-of-line structure on the substrate, and a back-end-of-line structure on the front-end-of-line structure, wherein the back-end-of-line structure includes:
- a plurality of metal layers stacked on the front-end-of-line structure, an uppermost metal layer of the metal layers including a pad therein;
- a redistribution line on the pad, the redistribution line being configured to electrically connect the pad and the external connection member; and
- a first dielectric layer between the uppermost metal layer and the redistribution line; and
- an upper dielectric layer on the redistribution line, wherein the external connection member includes an under-bump pattern connected to the redistribution line through an opening of the upper dielectric layer, wherein the under-bump pattern includes a first sidewall and a second sidewall that are opposite to each other, wherein the first sidewall is in contact with the opening of the upper dielectric layer, and wherein the second sidewall is spaced apart from the upper dielectric layer.

17. The semiconductor package of claim 16, wherein the upper dielectric layer includes:
- a second dielectric layer that is on the redistribution line and the first dielectric layer; and
- a third dielectric layer on the second dielectric layer, wherein the second dielectric layer includes an inorganic dielectric layer, and wherein the third dielectric layer includes an organic polymer layer.

18. The semiconductor package of claim 16, wherein the external connection member further includes a solder pattern on the under-bump pattern, and wherein an upper portion of the under-bump pattern between the solder pattern and the upper dielectric layer has a height of about 20 micrometers (μm) to about 50 μm.

19. The semiconductor package of claim 16, wherein the first dielectric layer includes a first region and a second region beside the first region, the first region vertically overlapping the redistribution line, wherein the redistribution line includes a first sidewall at an end thereof, wherein the second region includes a recess in an upper portion thereof, an inner wall of the recess including a second sidewall connected to the first sidewall, and wherein a slope of the first sidewall is different from a slope of the second sidewall.

20. The semiconductor package of claim 16, wherein the upper package includes:
- an upper substrate;
- a die mounted on the upper substrate; and
- an upper molding layer on the upper substrate and covering the die.

* * * * *